「(12) United States Patent
Ausserlechner

(10) Patent No.: US 11,073,574 B2
(45) Date of Patent: Jul. 27, 2021

(54) HALL SENSOR APPARATUS AND METHOD FOR MEASURING A MAGNETIC FIELD

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 232 days.

(21) Appl. No.: 16/218,852

(22) Filed: Dec. 13, 2018

(65) Prior Publication Data

US 2019/0242955 A1    Aug. 8, 2019

(30) Foreign Application Priority Data

Feb. 5, 2018 (DE) .................. 102018201724.7

(51) Int. Cl.

| | |
|---|---|
| G01N 27/00 | (2006.01) |
| G01R 31/02 | (2006.01) |
| G01R 33/12 | (2006.01) |
| G01R 35/00 | (2006.01) |
| G01R 1/04 | (2006.01) |
| G01R 1/067 | (2006.01) |
| G01R 1/073 | (2006.01) |
| G01R 33/07 | (2006.01) |
| G01D 5/12 | (2006.01) |
| G01D 5/14 | (2006.01) |
| G01B 7/00 | (2006.01) |
| G01R 33/00 | (2006.01) |

(52) U.S. Cl.
CPC ............ *G01R 33/075* (2013.01); *G01D 5/145* (2013.01); *G01R 33/0017* (2013.01); *G01R 33/077* (2013.01)

(58) Field of Classification Search
CPC ...... G01R 33/07; G01R 33/075; G01R 33/077; G01R 33/072; G01R 33/09; G01D 5/12; G01D 5/14; G01D 5/145; G01B 7/00; G01B 7/30
See application file for complete search history.

(56) References Cited

U.S. PATENT DOCUMENTS

| | | | |
|---|---|---|---|
| 2014/0117983 A1* | 5/2014 | Rohrer .................. | H01L 43/065 324/251 |
| 2014/0169311 A1* | 6/2014 | Nam ..................... | H04L 5/0023 370/329 |
| 2016/0041007 A1* | 2/2016 | Lang .................... | G01R 33/077 324/207.2 |

(Continued)

FOREIGN PATENT DOCUMENTS

DE    102013205313 A1    10/2014

*Primary Examiner* — Neel D Shah
(74) *Attorney, Agent, or Firm* — Harrity & Harrity, LLP

(57) ABSTRACT

A Hall sensor apparatus has a Hall effect field with at least five contacts which are wired to at least five connections, wherein none of the at least five contacts is wired to more than one of the at least five connections, a supply circuit and a measurement circuit. In a first operational phase, a supply current enters the Hall effect field or leaves the Hall effect field through one single connection of the at least five connections, and two differential signals are measured at different common-mode potentials in each case between two of the at least five connections. The measurement circuit is designed to combine the measured differential signals into a total signal.

20 Claims, 12 Drawing Sheets

(56) References Cited

U.S. PATENT DOCUMENTS

2016/0061912 A1\* 3/2016 van Vroonhoven .......................... G01R 33/072
324/225

\* cited by examiner

Phase 1

Phase 2

Phase 3

Phase 4

Phase 5

Phase 6

Phase 7

Phase 8

1st operational phase

2nd operational phase

3rd operational phase

HALL SENSOR APPARATUS AND METHOD FOR MEASURING A MAGNETIC FIELD

RELATED APPLICATION

This application claims priority under 35 U.S.C. § 119 to German Patent Application No. 102018201724.7, filed on Feb. 5, 2018 the content of which is incorporated by reference herein in its entirety.

TECHNICAL FIELD

The present disclosure concerns Hall sensor apparatuses with at least five connections and methods for measuring a magnetic field using a corresponding Hall sensor apparatus.

BACKGROUND

Apparatuses sensitive to magnetic fields are used to measure magnetic fields. Examples of apparatuses sensitive to magnetic fields are Hall sensor apparatuses which have an output signal which is proportional to an existing magnetic field. Apparatuses sensitive to magnetic fields can output a non-zero signal in the presence of a zero magnetic field. This signal is referred to as an offset error (zero field error) of the apparatus or sensor element.

Hall sensor apparatuses or Hall effect sensors comprise a Hall effect field in which the Hall effect takes place, said field sometimes being referred to as the active field and being provided with three or more contacts. The Hall effect field can generally be formed from a semiconductor material (for example silicon) in a semiconductor substrate. The Hall effect field can be formed, for example, as a doped well in a semiconductor material of a different doping type. A contact can be formed by a more highly doped contact area in or in contact with the Hall effect field. A contact can be formed by a contact diffusion or an implementation process. A plurality of contacts can be connected via metal lines to the same connection, for example in an intermediate connection layer of the semiconductor technology. Connections are used to supply the apparatus or component with electrical power and pick up its output signals.

Hall plates, which are sometimes referred to as horizontal Hall elements, are flat apparatuses and can have a thickness which is 5 to 10,000 (typically 50) times less than their lateral dimension. Hall plates are used to measure magnetic field components along their thickness direction (i.e. the direction into the semiconductor substrate or in the direction perpendicular to a main surface of the semiconductor substrate). In silicon technology, Hall plates are typically 1 to 3 μm thick and in lateral directions 10 to 100 μm in size. The layout of Hall plates can be rectangular, square, circular, octagonal, cruciform or even triangular.

Vertical Hall effect apparatuses (VHalls) are thicker apparatuses in which one of the lateral dimensions is comparable (for example 0.2 times up to 10 times) with their dimension in the thickness direction (i.e. the direction into the semiconductor substrate or perpendicular to a main surface of the semiconductor substrate). Vertical Hall effect apparatuses are frequently in the form of long strips, usually straight, sometimes curved, arched or even annular. Vertical Hall apparatuses are used to measure magnetic field components parallel to the main surface of the semiconductor substrate.

Hall effect apparatuses with four connections can be operated in a spinning-current mode, wherein, in a first operational phase, a supply current is produced by a first pair of connections and a voltage is picked up on a second pair of connections. In a second operational phase, the first and second pairs of connections are interchanged and the voltages of both operational phases are finally combined (added or subtracted) in order to obtain a total signal. The zero field error of this total signal can be referred to as the residual offset.

Hall plates with eight contacts have been described which are operated in a spinning-current mode, wherein, in each operational phase of the spinning-current mode, current flows between two diagonally opposite contacts and a signal is picked up on only one contact pair, said signal having a common-mode potential of 50% of the supply voltage. The remaining four contacts are not used in this operational phase. The residual offset can be reduced by using eight contacts.

Hall plates with four contacts are furthermore known, wherein it has been described that Hall plates of this type have a maximum signal-to-noise ratio if they are symmetrical and if the contacts are not too small and not too large.

SUMMARY

A need exists for alternative Hall sensor apparatuses and methods for measuring a magnetic field which enable an improved signal-to-noise ratio.

Examples of the present disclosure produce a Hall sensor apparatus with a Hall effect field with at least five contacts which are wired to at least five connections, wherein none of the at least five contacts is wired to more than one of the at least five connections, with a supply circuit and a measurement circuit. In a first operational phase, a supply current passes through one single connection of the at least five connections into the Hall effect field or out of the Hall effect field, and two differential signals are measured at different common-mode potentials in each case between two of the at least five connections. The measurement circuit is designed to combine the measured differential signals into a total signal.

Examples of the present disclosure produce a method for measuring a magnetic field using a Hall sensor apparatus with a Hall effect field with at least five contacts which are wired to at least five connections, wherein none of the at least five contacts is wired to more than one of the at least five connections. During an operational phase, a supply current is generated by the Hall effect field, wherein the supply current enters the Hall effect area or leaves the Hall effect area through one single connection of the at least five connections. Two differential signals at different common-mode potentials are measured in each case between two of the at least five connections. The measured differential signals are combined to form a total signal.

In examples of the present disclosure, at least two Hall signals are therefore measured in the form of differential signals, while the same supply current is generated in an operational phase through the Hall effect field, thus enabling an increase in the signal-to-noise ratio. Since the Hall signals are measured at different common-mode potentials, the noise components of said signals may be at least partially statistically independent from one another, so that an increase in the signal-to-noise ratio is possible through a combination of the Hall signals. In examples, a larger number of contacts can furthermore be provided, wherein, during an operational phase, more than two pairs of the connections can be coupled to the measurement circuit as measurement pairs in order to measure more than two Hall signals in the form of differential signals at different common-mode potentials. As a result, the signal-to-noise ratio can be further increased.

In examples, it can be achieved that the Hall signals are measured at different common-mode potentials, through the arrangement of the contacts which in each case serve as supply contacts and measurement contacts. A straight virtual line which interconnects the contacts of the first measurement pair is assumed to be a first virtual line. A straight virtual line which interconnects the contacts of the second measurement pair is assumed to be a second virtual line. A straight virtual line which connects two contacts which are connected to connections which are connected to the supply circuit is assumed to be a third virtual line. Measurement signals at different common-mode potentials can be obtained if the first virtual line and the second virtual line intersect the third virtual line at different locations. The current flowing between the two contacts which are coupled to the supply circuit thus runs through a potential gradient between the intersection point of the first and third virtual line and the intersection point of the second and third virtual line (i.e. between the first Hall signal and the second Hall signal), so that the first Hall signal is measured at a common-mode potential differing from that of the second Hall signal. In other words, the different Hall signals are measured at different positions along the current path of the supply current through the Hall effect field. The same current or the same current line thus passes through two fields and generates a Hall voltage in both fields which is made accessible to a measurement in each case with one contact pair. This current line is therefore used twice, so that a maximum output signal can be generated with minimal electrical power.

Examples are thus based on the idea of measuring more than one output signal in each operational phase, i.e. the same supply current between the same supply contacts, wherein the output signals are measured at different common-mode potentials.

In examples of the present disclosure, the Hall sensor apparatus has a control circuit which is designed to couple the at least five connections selectively to the supply circuit and the measurement circuit in more than one operational phase, so that a supply current enters the Hall effect area or leaves the Hall effect area through one single connection of the at least five connections in each operational phase, and two differential signals are measured at different common-mode potentials in each operational phase. In examples, the control circuit can be designed to couple a group of at least two connections to the supply circuit and to couple a first and a second pair of the connections to the measurement circuit in the first operational phrase, and to couple a group, differing from the first group, of at least two connections to the supply circuit in a second operational phase, and to couple two other pairs of connections, differing from the first and second pair, to the measurement circuit as measurement pairs. Examples of the present disclosure thus enable a switchover between different supply connections and measurement connections in different operational phases. As a result, a reduction in the residual offset can be achieved along with an increased signal-to-noise ratio by combining the Hall signals obtained during the different operational phases.

In examples of the present disclosure, the connections have N pairs of connections, where N is a natural number greater than or equal to three, wherein the control circuit is designed to implement a spinning-current mode, wherein a different pair of connections is coupled to the supply circuit as a supply pair in each operational phase of the spinning-current mode and the remaining N−1 pairs are coupled to the measurement circuit as measurement pairs, wherein the supply current is fed through a different connection into the Hall effect field in the spinning-current mode. The residual offset can be further reduced as a result.

In examples of the present disclosure, the Hall sensor apparatus has 2N connections with 3≤N, where N is a natural number. A better reduction of the residual offset can be achieved in a spinning-current mode through a larger number of connections. However, the distance between the individual contacts is reduced by a larger number of connections and assigned contacts, as a result of which the contacts are located closer to one another, so that the statistical independence of the noise of the Hall signals measured in an operational phase decreases and most of the current is removed from the Hall effect field through the short-circuiting effect of the contacts, thus reducing the strength of the Hall effect signal. It has been shown that a number of 2N connections with 3≤N≤6 enables both an improved signal-to-noise ratio and a reduced residual offset.

In examples of the present disclosure, one pair of the connections is coupled to the supply circuit as a supply pair in the first operational phase, wherein a direction in which the contacts which are connected to the connections of the supply pair are located opposite one another is perpendicular to directions in which the contacts which are connected to the connections of the connection pairs are located opposite one another. In other words, a virtual line which connects the contacts which are connected to the connections of a respective measurement pair is perpendicular to a virtual line which connects the contacts which are connected to the connections of the supply pair. As a result, it is possible for the contacts assigned to a respective measurement pair to be at an isopotential level, so that the zero field error (offset error) can be reduced or minimized. In examples, the connections of a first contact and a second contact whose distance from the first contact is greater than the distance from all other contacts, is coupled to the supply circuit as a supply pair.

In examples, a supply current is fed through contacts into the Hall effect field, as a result of which a potential distribution occurs in an extensive area with a diminishing magnetic field. The contact pairs for the signal pick-up can then be located on constant-potential lines. In examples, there are at least two contact pairs for the signal pick-up which are located on two different lines. In examples, the common-mode potentials of M signal contact pairs differ from one another by at least $V_{sup}/(M+1)/2$, where $V_{sup}=\max(V)-\min(V)$ and V=the electrical potential in the Hall effect field.

In examples, the connections can have 2N−1 connections, where N≥3, where N is a natural number, wherein three connections of the at least five connections are coupled to the supply circuit in the first operational phase, wherein an electrical resistance through the Hall effect field between a first of the three connections and a third of the three connections and an electrical resistance through the Hall effect field between a second of the three connections and the third of the three connections are equal, and wherein 2N−2 connections of the at least five connections form N−1 connection pairs in the first operational phase, wherein signals at different common-mode potentials are measured on 2≤M≤N−1 connection pairs. A different group of three connections can be coupled to the supply circuit in each operational phase of a spinning-current mode. Examples of the present disclosure thus enable Hall sensor apparatuses with an odd number of connections.

In examples of the present disclosure, the contacts are disposed symmetrically in relation to an axis of symmetry through the Hall effect field and/or in relation to a geometric centre of the Hall effect field. An arrangement of this type enables a reduction in the residual offset, for example in a spinning-current mode.

In examples of the present disclosure, the measurement circuit is designed to combine the differential signals measured in one or each operational phase into a total signal which is based on a linear combination of the measured differential signals. It has been found that an improved signal-to-noise ratio can be achieved as a result. In examples of the present disclosure, weighting factors are used in the calculation of the linear combination, wherein differential signals which are measured at the same common-mode potential have the same weighting factors in terms of amount. The weighting factors may depend on the geometric arrangement of the contacts which are connected to the connections of the measurement pairs. The weighting factors may, for example, be determined in advance in test series and may be chosen in order to achieve an optimum signal-to-noise ratio. In examples, the linear combination is an addition. It has surprisingly been found that an increased signal-to-noise ratio can be achieved through an addition of this type in which weighting factors can be used.

In examples, the measurement apparatus is designed to add up the measurement signals of all operational phases in order to obtain a final output signal. Both an increased signal-to-noise ratio and a reduced residual offset can be achieved as a result.

In examples, the contacts are arranged with a uniform angular separation around the circumference of the Hall effect field. It has been shown that the calculation of the final output signal can be simplified through a corresponding arrangement.

BRIEF DESCRIPTION OF THE DRAWINGS

Examples of the present disclosure are explained in detail below with reference to the attached drawings. In the drawings.

DETAILED DESCRIPTION

Figure 1:
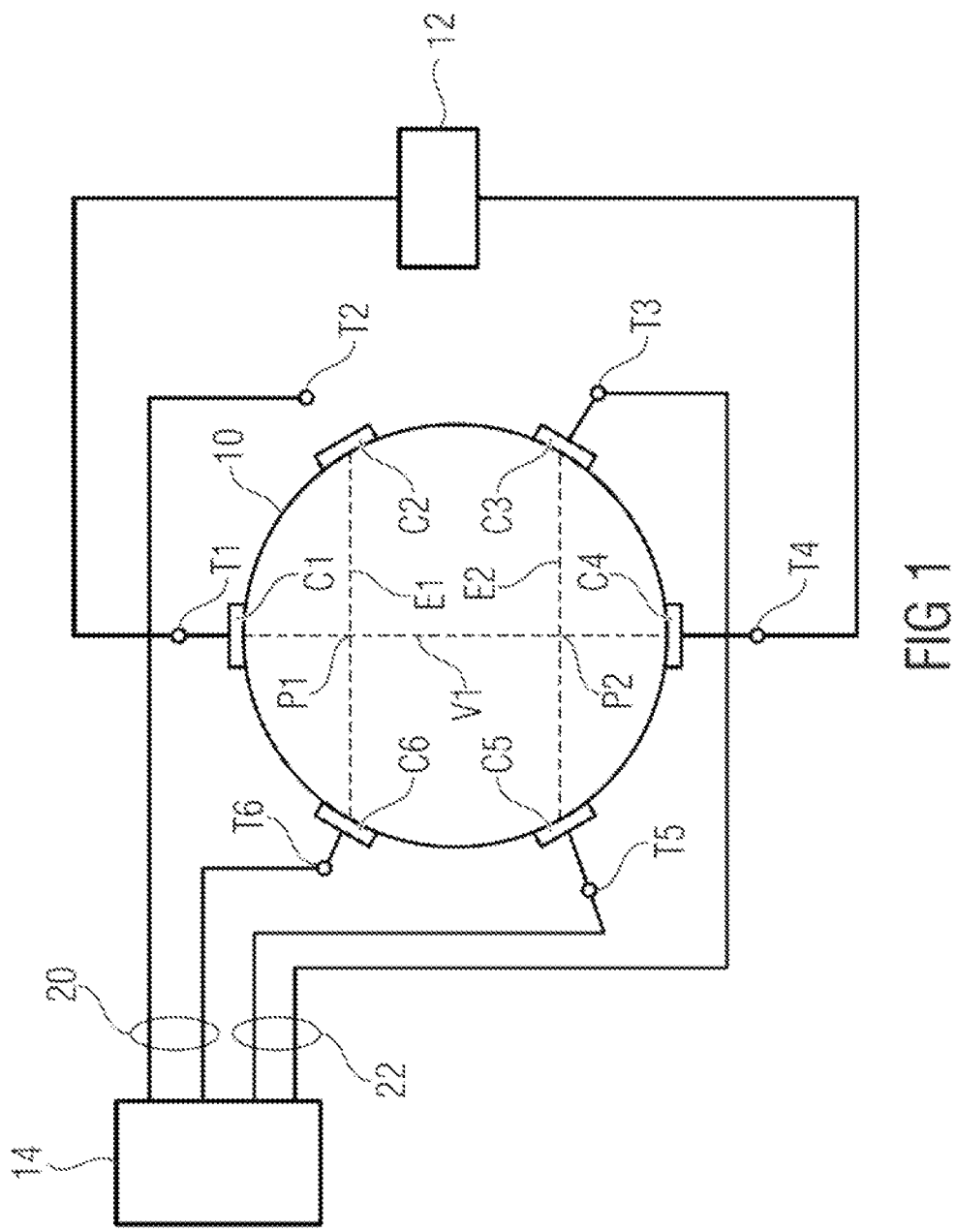
FIG. 1 shows a schematic representation of one example of a Hall sensor apparatus with six connections.

Examples of the present disclosure are set out in detail below using the attached drawings. It should be noted that the same elements or elements with the same functionality may be denoted with the same or similar reference numbers in the drawings, wherein a repeated description of such elements can be omitted. Descriptions for elements with the same or similar reference numbers can therefore be mutually interchangeable.

A plurality of details are set out in the following description in order to provide a thorough explanation of examples of the present disclosure. However, it will be evident to persons skilled in the art that examples of the present disclosure can be put into practice without these specific details. In other cases, sufficiently known structures and apparatuses are shown in a schematic cross-sectional view or top view instead of in detail in order to avoid obscuring the description of examples. Features of the different examples described below can furthermore be combined with other features of other examples, unless expressly indicated otherwise herein.

Hall sensor apparatuses as described herein may have Hall effect elements. Hall effect elements can include one or more Hall effect fields with supply connections and signal connections. The Hall effect takes place in the Hall effect field, wherein the Lorentz force of the magnetic field act on moving charge carriers produces an electric Hall field. The moving charge carriers are supplied by an electrical energy source which is connected to the supply connections. The output signal of the Hall effect element can be picked up on the signal connections. Each connection is connected to at least one contact for the Hall effect field, wherein the contacts are ohmic contacts, thus making the Hall effect element a purely resistive element.

In examples, a Hall effect field may be a semiconductor area of a charge carrier type, for example a p-type or n-type. In examples, the semiconductor area is an n-type, due to the greater charge carrier mobility and the resulting greater Hall signal-to-noise ratio. In examples, the semiconductor can be formed in a semiconductor substrate, for example as a well of one doping type in a semiconductor substrate of an opposite doping type. In examples, the semiconductor substrate and the semiconductor area can comprise silicon. A contact may be an area having the same doping as the Hall effect field with a higher doping concentration. A contact may, for example, have a doping concentration that is at least 10 times, at least 100 times and up to 1,000 times higher than that of the Hall effect field. Contacts can be implemented as contact wells which can be technologically produced through diffusion or implantation. These contact wells can be connected to lines (conductor paths) with metallic characteristics, for example by means of Wolfram contact plugs. Diffusion barriers having a thickness in the nanometer range, for example made from titanium, can be provided. The lines with metallic characteristics may, for example, have aluminum or copper alloys with small silicon components or polysilicon which may or may not be siliconized. The metallic conductor paths, which are also referred to as wiring, can lead away from the Hall element and to a circuit where the conductor paths can branch out. At a position before a branching of this type, the conductor paths can be conceptually cut open, wherein this position on the conductor path can be referred to as a connection.

In examples, each connection is connected, i.e. wired, to one contact. In other examples, one or more connections can be connected, i.e. wired, to a plurality of contacts. None of the contacts is connected, i.e. wired, to more than one connection. In examples of the present disclosure, a control circuit is provided which has switches to switch over between a current feed and a signal pick-up. In other examples, a switchover of this type is not necessary, so that the corresponding connections can be connected via lines directly to the supply circuit or the measurement circuit.

In examples of the present disclosure, the Hall effect field can be implemented by means of a Hall plate. As already explained, Hall plates are Hall effect elements in the form of a plate, the thickness of which is small compared with their lateral dimensions. Hall plates are capable of measuring magnetic field components perpendicular to the plate (i.e. in their thickness direction). The plate can be parallel to the main surface of a semiconductor substrate, since the Hall effect field can be implemented as a well in the semiconductor substrate. The plate can thus measure fields perpendicular to the main surface of the substrate, for example a chip. In examples, the Hall effect field can be a vertical Hall effect element in which, as explained above, one of the lateral dimensions is comparable to the dimension in the thickness direction. Vertical Hall effect elements can be used to measure magnetic field components parallel to the main surface of the semiconductor substrate, for example the chip.

A supply circuit or bias circuit for a Hall effect element or a Hall effect field can be understood herein to mean an electronic circuit which is capable of supplying the Hall effect field with electrical energy in order to generate a supply current through the Hall effect field and therefore moving charge carriers through the Hall effect field. A measurement circuit or readout circuit for a Hall effect element or a Hall effect field can be understood herein to mean an electronic circuit which is capable of extracting at least one output signal from the Hall effect field. The supply circuit and/or the measurement circuit can be implemented on the same semiconductor substrate as the Hall effect field or on a separate substrate.

A circuit for supplying electrical energy in order to generate a current flow between supply connections of the Hall effect field can be used as a supply circuit. Current sources, for example, with an infinitely high internal resistance can be used. In alternative examples, voltage sources with an infinitely low internal resistance can also be used, or all intermediate variants with a finite internal resistance. The measurement circuit can be designed to measure Hall signals. Hall signals can comprise not only voltages which can be measured in the open-circuit case with a voltmeter with an infinitely high internal resistance. Hall signals can also comprise currents which can be measured in the short-circuit case with an ammeter with an infinitely low internal resistance. All intermediate variants with a finite internal resistance can also be used.

In examples, the supply circuit can thus be configured to impress a current by means of a current source and the measurement circuit can be configured to pick up voltages as Hall signals, for example by means of voltmeters. In other examples, the supply circuit can thus be configured to impress a voltage by means of a voltage source and the measurement circuit can be configured to pick up currents as Hall signals, for example by means of ammeter circuits.

The measured Hall signals are differential signals. In examples, a differential signal can be a voltage between two connections. In examples, a differential signal can be a current between two connections. In examples, the measurement circuit can thus be designed to measure a voltage between two connections. In examples, the measurement circuit can be designed to measure a current between two connections.

Examples of the disclosure relate to Hall sensor apparatuses which have Hall effect fields with at least five connections. Examples relate, in particular, to those Hall sensor apparatuses which enable a higher Hall signal-to-noise ratio to be achieved with a constant current consumption. Examples enable this by measuring a plurality of Hall signals with different common-mode potentials during an operational phase. Examples furthermore enable a smaller residual offset error by interchanging supply connections and signal connections in different operational phases. Examples enable a spinning-current mode, wherein a spinning-current mode is understood to mean a mode in which supply connections and signal connections (measurement connections) are interchanged in different operational phases. In examples in which the Hall effect field has a Hall plate, a spinning-current mode can be understood to mean a mode in which the supply connections and the measurement connections are interchanged in such a way that a rotation of the current direction occurs.

FIG. 1 shows schematically one example of a Hall sensor apparatus with a Hall effect field 10 in the form of a Hall plate. The Hall sensor apparatus has at least five connections, in the example shown six connections T1 to T6. Each of the connections T1-T6 is connected in each case to one contact C1 to C6 for the Hall effect field 10. The Hall sensor apparatus has a supply circuit 12 and a measurement circuit 14.

FIG. 1 shows a first operational phase in which two of the connections T1 and T4 are coupled to the supply circuit 12. A first pair 20 which has the connections T2 and T6, and a second pair 22 which has the connections T3 and T5 are coupled to the measurement circuit 14 as measurement pairs.

As shown in FIG. 1, the contacts C1 to C6 are arranged in such a way that a straight virtual line E1 which connects the contacts C2 and C6 assigned to the first connection pair 20 intersects a straight virtual line V1 which connects the contacts C1 and C4 assigned to the supply connections T1 and T4 at a position P1. The contacts C1 to C6 are furthermore arranged in such a way that a virtual line E2 which connects the contacts C3 and C5 assigned to the second connection pair 22 intersects the virtual line V1 at a second position P2 which differs from the first position P1. A first Hall signal measured between the connections T2 and T6 of the first pair 20 is therefore at a different common-mode potential compared with a second Hall signal measured between the connections T3 and T5 of the second pair 22. The reason for this is that the same current flow which is generated between the contacts C1 and C4 is used for both Hall signals, thereby enabling an energy efficiency. Since the Hall effect field is resistive, the current between the first Hall signal and the second Hall signal must have passed through a potential gradient. Both signals are thus measured at different common-mode potentials. The further apart the contacts on which the two signals are picked up are located in the direction of the virtual line V1, the more different the common-mode potential of both signals will be.

A connection T2 at a potential V2 and a connection T6 at a potential V6 can be considered for the definition of the common-mode potential. The common-mode potential is to be understood as the mean value of the potentials of both connections. In the case of a voltage pick-up, the differential signal is then defined by V2−V6 and the common-mode potential is defined by (V2+V6)/2. In the case of a current measurement, the ammeter short-circuits C2 with C6, so that V2=V6. This can also be referred to here as the common-mode potential (V2+V6)/2.

If, for example, the example shown in FIG. 1 is considered, a signal between two measurement connections can typically be picked up as the Hall signal, for example a voltage between them, i.e. the potential difference, such as e.g. V(T2)−V(T6). An associated common-mode potential (V(T2)+V(T6))/2 can furthermore be defined as the mean value of both connection potentials.

The corresponding common-mode potential relating to the connections T3 and T5 is (V(T3)+V(T5))/2. In examples of the disclosure, a different common-mode potential thus occurs in the case of the second Hall signal which is picked up between the connections T3 and T5, i.e. V(T3)−V(T5), compared with the case of the first Hall signal which is picked up between the connections T2 and T6.

In the example shown in FIG. 1, the contacts C1-C6 are arranged with a uniform angular separation around the circumference of the Hall effect field 10. The contacts C1-C5 are furthermore arranged not only symmetrically in relation to an axis of symmetry through the Hall effect field but also symmetrically in relation to a geometric center of the Hall effect field 10. In the example shown, in which the Hall effect field 10 is a circular Hall plate, the geometric center is, for example, the center of the circle. The contacts are normally arranged close to the edge of the Hall effect field. In examples, the contacts can also be arranged at a greater or lesser distance from the edge of the Hall effect field, but the strength of the Hall effect signal is reduced as a result.

In the example shown in FIG. 1, the connections have six connections. In examples, the Hall sensor apparatus can generally have N connection pairs, where N is a natural number greater than or equal to 3. In FIG. 1, N=3. A direction in which the contacts T1 and T4 which are connected to the supply circuit 12 are located opposite one another (direction of the virtual line V1) can be perpendicular to directions in which the contacts C2 and C6 of the first measurement pair 20 and the contacts C3 and C5 of the second measurement pair 22 are located opposite one another (directions of the lines E1 and E2). The distance between the contacts C1 and C4 is greater than the distance between the contact C1 and all other contacts. Generally, connections which are connected to contacts which are located diametrically opposite one another over the Hall effect field can in each case form a supply pair. Connections which are connected to contacts whose virtual connection line is perpendicular to the virtual connection line of the contacts of the supply pair can in each case form a measurement pair for this supply pair.

In examples, the Hall sensor apparatus has 2N contacts, with N≥3, wherein two contacts are used in order to supply the Hall effect field with electrical energy. If the Hall effect field is symmetrical, the other contact pairs (2N−2 contacts) can be grouped into N−1 pairs of contacts, wherein the signal in each pair moves toward zero if no magnetic field is present and the offset error is ignored. In examples, N−1 output signals are therefore used instead of using only one output signal. The noise contributions of the output signals can be at least partially preferably essentially statistically independent from one another and are thus added according to $\sqrt{(N_1^2+N_2^2+N_3^3+...+N_{N-1}^2)}$ if the signals are added ($S_1$+ $S_2$+$S_3$+ . . . +$S_{N-1}$). The signal-to-noise ratio can thus be improved while only a current which flows between the Nth contact is used and thus without additional current consumption.

In the example shown in FIG. 1, the connections T1 and T4 can be connected to the supply circuit 12 and the connections T2, T3, T5 and T6 can be connected to the measurement circuit 14 without switches. Such an example can be used if no switchover of the connections is required, for example if no direct-signal magnetic field (i.e. a static magnetic field) is to be measured, but rather an alternating-signal magnetic field (i.e. a dynamic, temporally variable magnetic field). In such a case, a control circuit which is designed to switch over supply connections and measurement connections is not required.

Figure 2:
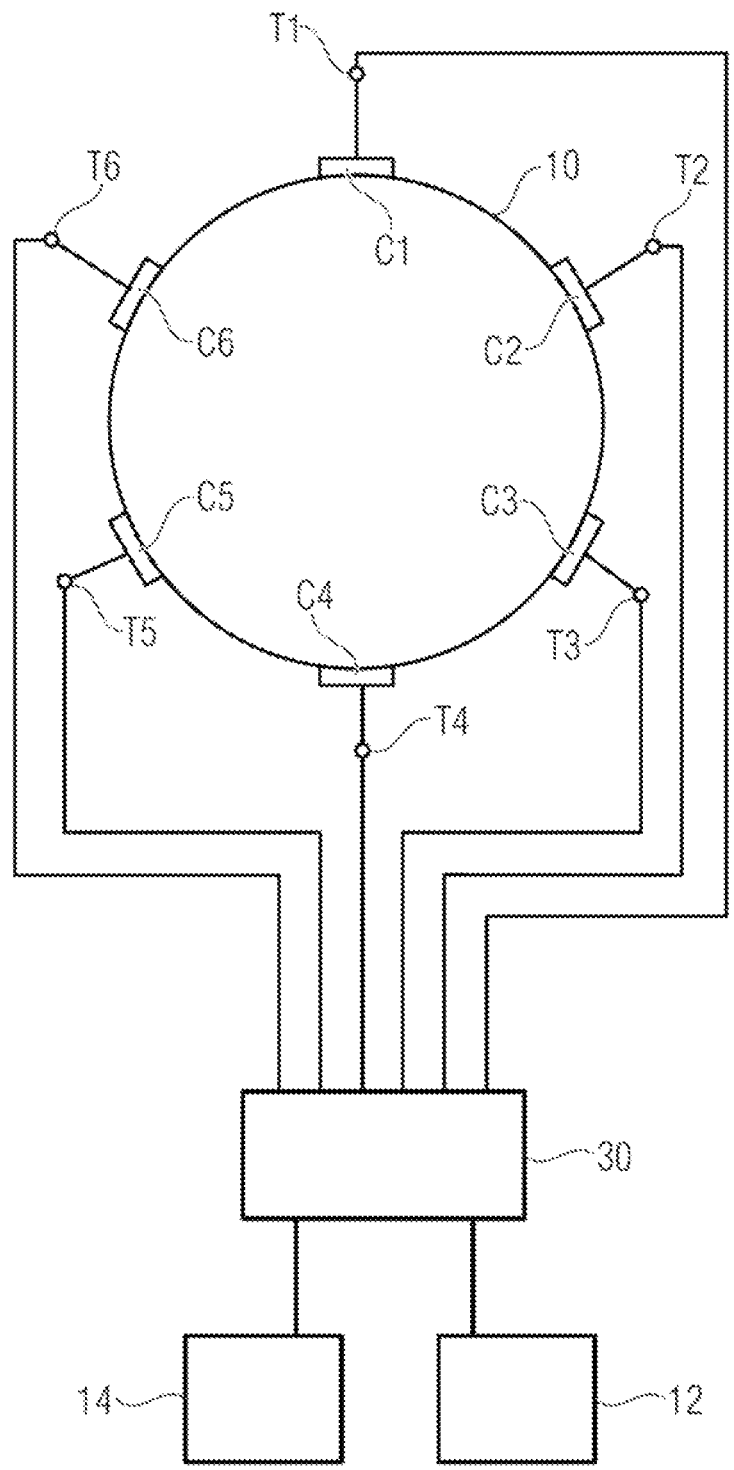
FIG. 2 shows a schematic representation of a further example of a Hall sensor apparatus with six connections.

FIG. 2 shows one example of a Hall sensor apparatus in which the Hall effect field 10 with the connections T1 to T6 and the contacts C1-C6 corresponds to the Hall effect field shown in FIG. 1. In the example shown in FIG. 2, a control circuit 30 is additionally provided which is designed to connect the connections T1 to T6 selectively to the supply circuit 12 and to the measurement circuit 14. For this purpose, the control circuit 30 can have corresponding switches via which the connections T1 to T6 can be coupled selectively to connections of the supply circuit 12 and the measurement circuit 14. The above statements otherwise apply accordingly in respect of FIG. 1.

Figure 3:
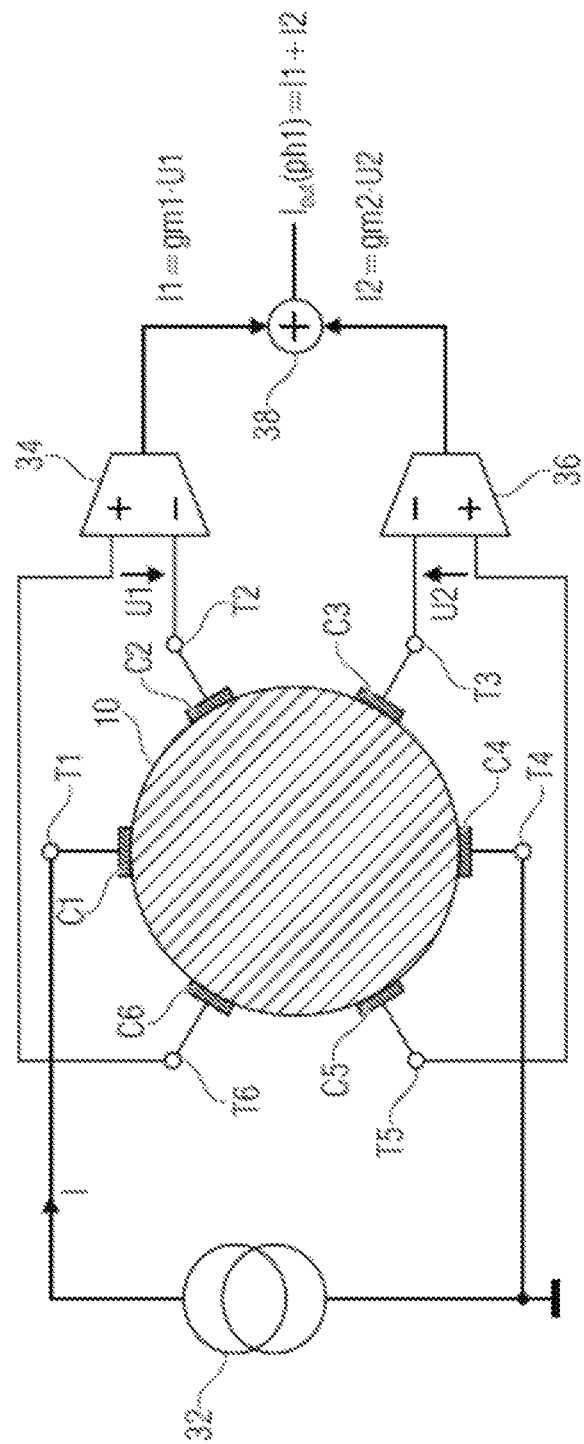
FIGS. 3 and 4 show schematic representations of one example of a Hall sensor apparatus with six connections which show details of the supply circuit and a measurement circuit in different operational phases.
Figure 4:
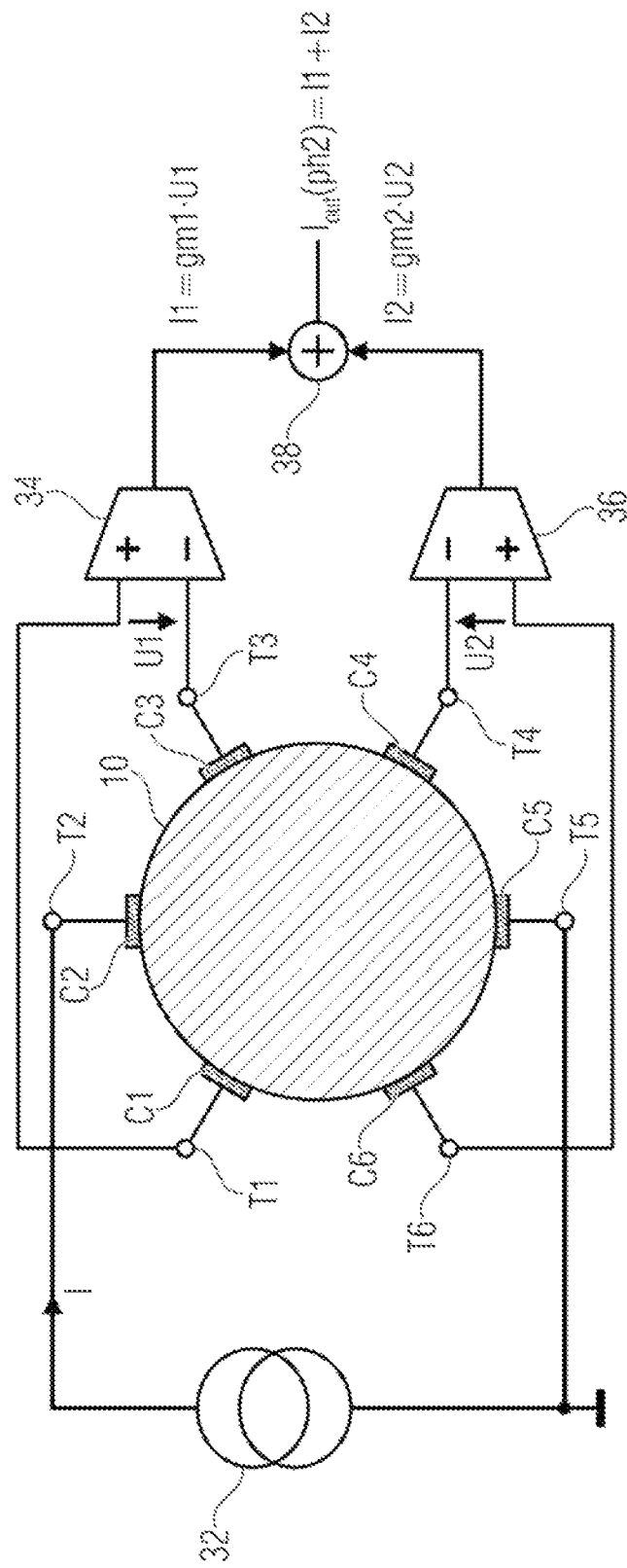

FIGS. 3 and 4 show one example of a corresponding Hall sensor apparatus with a Hall effect field 10 and six contacts C1 to C6 in two different operational phases.

For the sake of simplicity, the Hall effect field 10 is rotated 60° to the left in FIG. 4 compared with FIG. 3. A control circuit with corresponding switches for effecting the switchover of the respective connections is furthermore not shown in FIGS. 3 and 4 for the sake of simplicity.

As shown in FIGS. 3 and 4, the supply circuit can be implemented using a current source 32 which is designed to generate a supply current I between the respective contacts of the semiconductor field 10. The measurement circuit has two transconductance amplifiers 34 and 36.

In the operational phase shown in FIG. 3, the connections T1 and T4 serve as supply connections and the current source 32 is connected between these connections. The connections T2 and T6 serve as a first measurement pair and are connected to the inputs of the transconductance amplifier 34. The connections T3 and T5 serve as a second measurement pair and are connected to the inputs of the second transconductance amplifier 36. The output current of the first transconductance amplifier 34 depends on the voltage U1 between its input connections and its amplification factor gm1: I1=gm1·U1. The output current I2 of the first transconductance amplifier 36 depends on the voltage U2 between its input connections and its amplification factor gm2: I2=gm2·U2. The currents I1 and I2 are summed on a summation node 38 and produce an output current $I_{out}$(ph1) for the first operational phase which is shown in FIG. 3.

In the operational phase shown in FIG. 3, a current thus flows between the contacts C1 and C4, while two signals are picked up, one signal between the connections T2 and T6 and the other between the connections T3 and T5. In the ideal case, both pairs T2-T6 and T3-T5 have no output signal with no present magnetic field and a diminishing offset error due to the symmetry of the element. The transconductance amplifiers can be formed by differential input MOS transistor pairs of preamplifiers of ADCs (analog-digital converters), for example sigma delta ADCs. The transconductance amplifiers convert the signal from the voltage range into the current range. The signs should be noted here, wherein the potentials on T5 and T6 add positively to $I_{out}(ph1)$, whereas the potentials on T2 and T3 subtract from $I_{out}(ph1)$.

The operational phase shown in FIG. 3 can be regarded as an operational phase ph1 of a spinning-current mode. Further operational phases can be added in order to further reduce and, in the ideal case, completely eliminate an offset error. FIG. 4 thus shows a second operational phase ph2 in which the current source 32 is connected between the connections T2 and T5, while the first output signal is picked up between the connections T1 and T3 and the second output signal is picked up between the connections T4 and T6. The measurement signal $I_{out}(ph2)$ for the operational phase ph2 is then present at the output of the summation node 38.

Further operational phases can be added in order to further reduce the offset error, wherein the current is injected in each phase into one of the contacts C1 to Cn. The current can be injected, for example, in the first operational phase into the contact C1, in the second operational phase into the contact C2, in the third operational phase into the contact C3, in the fourth operational phase into the contact C4, in the fifth operational phase into the contact C5 and in the sixth operational phase into the contact C6. In examples, a spinning-current mode can thus be implemented in which the input current is injected in phase n into the contact Cn. The input current I should ideally be identical in all operational phases. Due to the symmetry of the Hall plate, gm1=gm2 should ideally also apply. In examples, the control circuit can thus be designed to implement a spinning-current mode, wherein the supply current is injected into another of the contacts in each operational phase of the spinning-current mode, and wherein the supply current is injected at least once into each of the contacts in the spinning-current mode.

It goes without saying that the control circuit for its part obviously has corresponding switches in order to connect the supply current source 32 and the transconductance amplifiers 34 and 36 to the different connections of the Hall effect field, wherein these switches are for their part not shown in FIGS. 3 and 4.

In examples of the present disclosure, the measurement circuit is configured to add up the signals in all individual operational phases of the spinning-current mode in order to obtain a total output signal, for example $I_{out}(total)=I_{out}(ph1)+I_{out}(ph2)+ \ldots +I_{out}(ph6)$. In examples, it may be possible to omit individual operational phases, wherein, however, the minimum number of operational phases in examples of the present disclosure is such that each contact pair which served as a supply contact pair in one operational phase also serves as a measurement contact pair in another operational phase. Conversely, each contact pair which served as a measurement contact pair in one operational phase should serve as a supply contact pair in another operational phase.

Other examples of the present disclosure can have a different number of connections. Hall sensor apparatuses can, for example, have four contact pairs which are connected in each case to corresponding connections, wherein one pair serves as a supply pair while three pairs are used simultaneously as output pairs in each operational phase. In the case of an apparatus with 2N contacts, a supply contact pair can be understood in each case to mean two contacts which are located diametrically opposite one another over the Hall effect field. Thus, in the example shown in FIG. 1, the contact pair C1-C4 forms a supply pair, the contact pair C2-C5 forms a supply pair, the contact pair C3-C6 forms a supply pair, the contact pair C4-C1 forms a supply pair, the contact pair C5-C2 forms a supply pair and the contact pair C6-C3 forms a supply pair.

Hall sensor apparatuses can accordingly also have a larger number of connections and assigned contacts, for example five contact pairs, six contact pairs, etc. However, if the number of connection pairs is too large, the assigned contacts and similarly the distance between the contacts will become very small. The number can thus be limited by the minimum structural size for a given technology. The requirement for switches and wiring also increases with an increasing number of contacts. It has been shown that both a good signal-to-noise ratio and a small residual offset error can be achieved in Hall sensor apparatuses with between three and six connection pairs.

Figure 5:
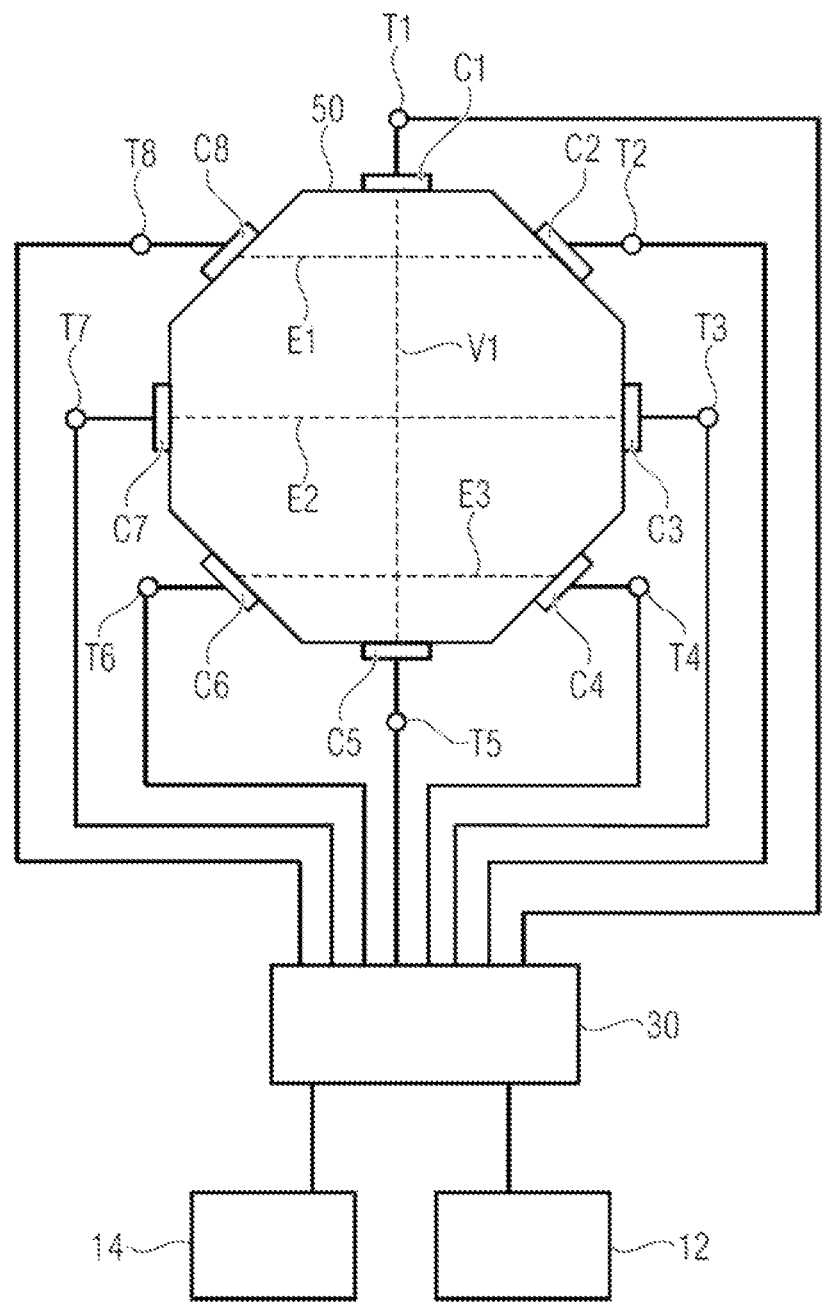
FIG. 5 shows a schematic representation of a Hall sensor apparatus with eight connections.

FIG. 5 shows one example of a Hall sensor apparatus which has eight connections T1 to T8 with assigned contacts. Of these contacts, four contact pairs are located in each case diametrically opposite one another over a Hall effect field 50. The Hall sensor apparatus has the Hall effect field 50 in the shape of an octagon. The eight contacts C1-C8 are distributed with a uniform angular spacing around the circumference of the Hall effect field 50. Each of the contacts C1 to C8 is connected to one of the connections T1 to T8.

A supply circuit 30 can again be provided which is configured to couple the connections T1 to T8 again selectively to the supply circuit 12 and to the measurement circuit 14. The supply circuit 30 can again have corresponding switches for this purpose.

One pair of contacts which are located diametrically opposite one another serves in each case as a supply pair, while the remaining contacts in each case serve for measurement. It is assumed, for example, that the contacts C1 and C5 in FIG. 5 form the supply pair, wherein a straight virtual line V1 connects the two contacts C1 and C5. The contacts C2 and C8 furthermore form a first measurement pair, the contacts C3 and C7 form a second measurement pair, and the contacts C4 and C6 form a third measurement pair. A straight virtual line E1 connects the contacts C2 and C8, a straight virtual line E2 connects the contacts C3 and C7, and a straight virtual line E3 connects the contacts C4 and C6. As is recognizable from FIG. 5, the virtual lines E1, E2 and E3 are in each case perpendicular to the virtual line V1.

In known Hall sensor apparatuses, a signal was picked up in each case on only one contact pair which is at a common-mode potential of approximately 50% of the voltage present or decreasing between the supply contacts C1 and C5, i.e. between the contacts C3 and C7 assuming that the contacts C1 and C5 are coupled to the supply circuit 12. In contrast, in examples of the disclosure, a Hall signal is picked up between a plurality of contact pairs, while the same supply current is generated by the Hall effect field. As shown in FIG. 5, the virtual lines E1, E2 and E3 intersect the virtual line V1 at different positions, so that the three Hall signals are measured at different common-mode potentials. It has been shown that an increased signal-to-noise ratio can be achieved as a result. It has furthermore been shown that, compared with a Hall sensor apparatus which has four contacts, an improved signal-to-noise ratio can be achieved with a lower current consumption, since the input resistance of the Hall sensor apparatus with eight contacts is greater on the supply contacts than that of the apparatus with four contacts and at the same time the output resistance through the three pairs of measurement contacts is lower than that of the apparatus with four contacts. An improvement in the signal-to-noise ratio of around 16% with a current consumption reduced by around 33% could be achieved here.

In examples, the measurement circuit is designed to calculate a linear combination of the output signals obtained during an operational phase. For example, a calculation of this type in the state shown in FIG. 5 in which the contacts C1-C5 serve as supply contacts can appear as follows: $V_{out}=V_{out}(T2-T8)+V_{out}(T3-T7)+V_{out}(T4-T6)$. However, since the noise voltages of all contact pairs are correlated to some extent, it is possible to optimize the signal-to-noise ratio by using weighting factors in the linear combination, such as e.g.: $V_{out}=V_{out}(T2-T8)+x \cdot V_{out}(T3-T7)+V_{out}(T4-T6)$, wherein the weighting factor x can assume a value, for example, between 0 and 2. In further examples, the other output signals can also be provided with a weighting factor which would, however, be the same in the example shown in FIG. 5 due to the symmetry. The weighting factors can, for example, be determined empirically through test runs, wherein it has been found, for an octagonal Hall effect field, that a weighting factor x of between 0.6 and 0.7, for example 0.65, can produce a maximum signal-to-noise ratio. The optimum weighting factors for a maximum signal-to-noise ratio theoretically depend on the statistical correlation of the noise voltages on the measurement contact pairs and are therefore a function of the geometry of the Hall effect field and the contacts.

It is thus possible to further improve the signal-to-noise ratio through the use of weighting factors of this type.

Figure 6A:
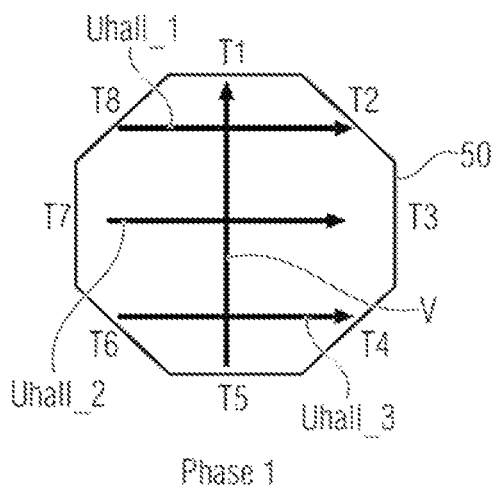
FIGS. 6A-6H show schematic representations to explain different operational phases of the Hall sensor apparatus shown in FIG. 5.
Figure 6B:
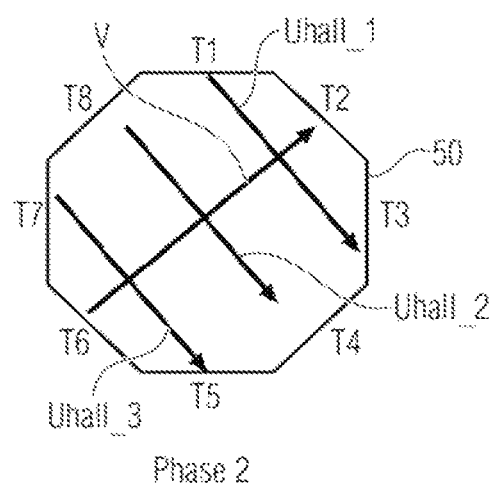
Figure 6C:
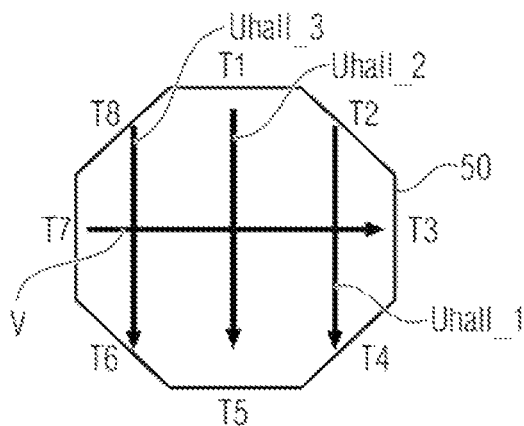
Figure 6D:
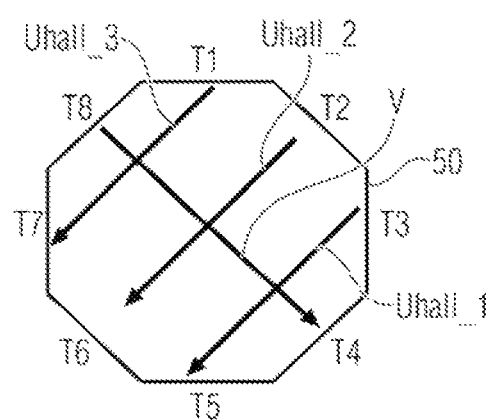
Figure 6E:
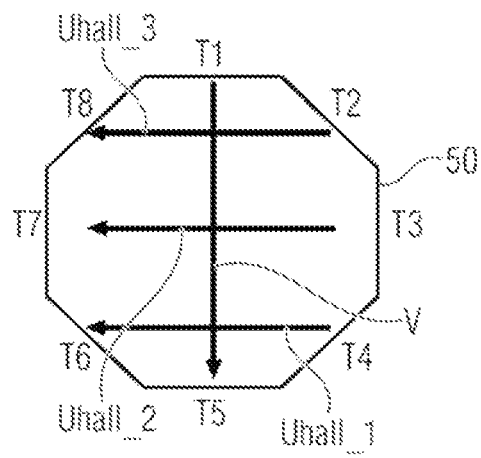
Figure 6F:
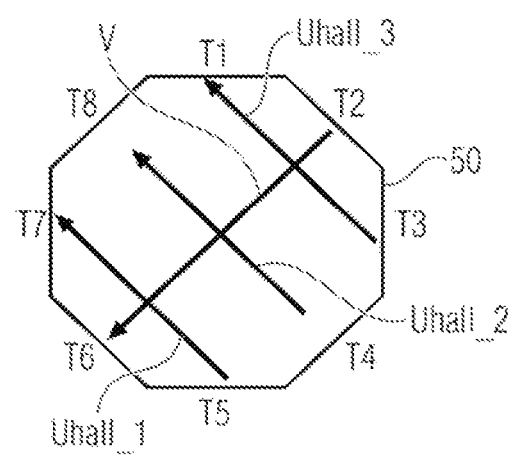
Figure 6G:
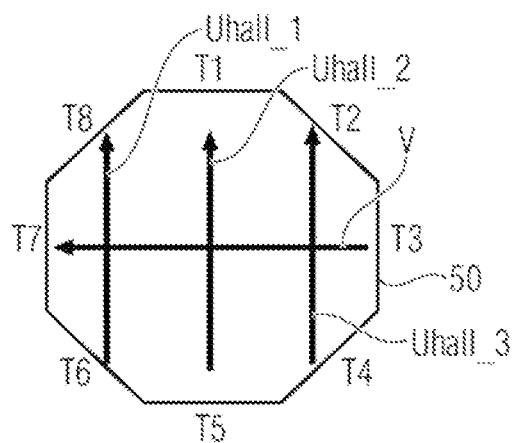
Figure 6H:
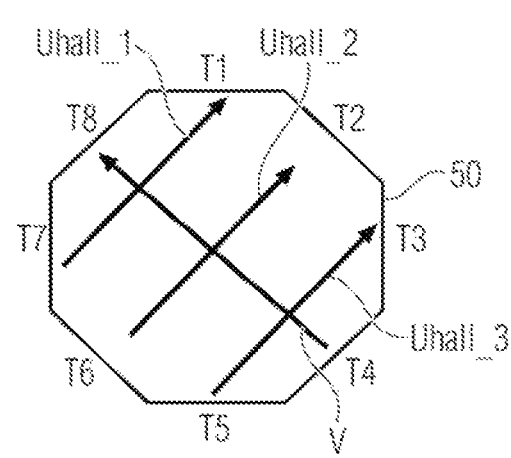

In examples of the present disclosure, the connections which are used as supply connections and measurement connections can again be interchanged, for example in order to implement a spinning-current mode in order to further reduce the residual offset error. In each operational phase (phase), one connection pair (and the associated contacts) serves as a supply pair, while the other connection pairs (and the associated contacts) serve as measurement pairs. FIGS. 6A to 6D show eight operational phases of a Hall sensor apparatus as shown in FIG. 5, wherein an arrow V in each case indicates the connections which act as a supply pair. In phase 1, the connection pair T1-T5 acts as a supply pair (FIG. 6A), in phase 2, the connection pair T6-T2 acts as a supply pair (FIG. 6B), in phase 3 the connection pair T7-T3 acts as a supply pair (FIG. 6C), in phase 4 the connection pair T8-T4 acts as a supply pair (FIG. 6D), in phase 5 the connection pair T1-T5 acts as a supply pair (FIG. 6E), in phase 6 the connection pair T2-T6 acts as a supply pair (FIG. 6F), in phase 7 the connection pair T3-T7 acts as a supply pair (FIG. 6G), and in phase 8 the connection pair T4-T8 acts as a supply pair (FIG. 6H). As is immediately evident from FIGS. 6A to 6H, the supply current thus rotates in each operational phase through 45°. Each connection furthermore acts in an operational phase as the supply connection on whose assigned contact the supply current enters the Hall effect field 50. Three output signals are furthermore picked up in each operational phase, as indicated by respective arrows Uhall_1, Uhall_2 and Uhall_3 in FIGS. 6A to 6H. In examples, only four operational phases can be used, as shown in FIGS. 6A to 6D. In other examples, eight operational phases can be used, as shown in FIGS. 6A to 6H, wherein the current flow direction is reversed in operational phases 5 to 8 compared with operational phases 1 to 4, as a result of which a reduction in the offset error occurs due to thermal error voltages caused by the Seebeck and Peltier effect.

In total, 24 output signals are produced when all eight operational phases are used. In the discussion below, the designations U1 to U8 in each case refer to the potentials on the connections T1 to T8. After the current flow direction has been reversed in operational phases 4 to 8 compared with operational phases 1 to 4, the voltages must also be inverted.

The 24 output signals PH1'-PH24' have been obtained as follows, as shown in FIGS. 6A to 6H:

Ph1': Uhall_1=U8-U2 sampled with a current flow from T5 to T1
Ph2': Uhall_2=U7-U3 sampled with a current flow from T5 to T1
Ph3': Uhall_3=U6-U4 sampled with a current flow from T5 to T1
Ph4': Uhall_1=U1-U3 sampled with a current flow from T6 to T2
Ph5': Uhall_2=U8-U4 sampled with a current flow from T6 to T2
Ph6': Uhall_3=U7-U5 sampled with a current flow from T6 to T2
Ph7': Uhall_1=U2-U4 sampled with a current flow from T7 to T3
Ph8': Uhall_2=U1-U5 sampled with a current flow from T7 to T3
Ph9': Uhall_3=U8-U6 sampled with a current flow from T7 to T3
Ph10': Uhall_1=U3-U5 sampled with a current flow from T8 to T4
Ph11': Uhall_2=U2-U6 sampled with a current flow from T8 to T4
Ph12': Uhall_3=U1-U7 sampled with a current flow from T8 to T4
Ph13': Uhall_1=U4-U6 sampled with a current flow from T1 to T5
Ph14': Uhall_2=U3-U7 sampled with a current flow from T1 to T5
Ph15': Uhall_3=U2-U8 sampled with a current flow from T1 to T5
Ph16': Uhall_1=U5-U7 sampled with a current flow from T2 to T6
Ph17': Uhall_2=U4-U8 sampled with a current flow from T2 to T6
Ph18': Uhall_3=U3-U1 sampled with a current flow from T2 to T6
Ph19': Uhall_1=U6-U8 sampled with a current flow from T3 to T7
Ph20': Uhall_2=U5-U1 sampled with a current flow from T3 to T7
Ph21': Uhall_3=U4-U2 sampled with a current flow from T3 to T7
Ph22': Uhall_1=U7-U1 sampled with a current flow from T4 to T8
Ph23': Uhall_2=U6-U2 sampled with a current flow from T4 to T8
Ph24': Uhall_3=U5-U3 sampled with a current flow from T4 to T8

In examples, the measurement apparatus can be configured in each case to calculate a linear combination of the output signals measured during one operational phase, for example using weighting factors as described above. In alternative examples, the evaluation circuit can be designed to combine only two of the three output signals in each operational phase, for example in each case only the output signals Uhall_1 and Uhall_3 in each operational phase. It has been shown that an improved signal-to-noise ratio can be obtained if all output signals Uhall_1, Uhall_2 and Uhall_3 obtained during one operational phase are combined, or if only two output signals, for example Uhall_1 and Uhall_3, obtained during one operational phase are combined.

In examples, the measurement circuit can furthermore be configured to combine the operational phase output signals obtained in this way for each operational phase with one another, for example to add them together, in order to obtain a total output signal.

On the whole, it has been shown that a signal-to-noise ratio improved by around 20% and a residual offset improved by a factor of 2 can be obtained using a corresponding Hall sensor apparatus. Particularly in the case of low supply voltages, i.e. low supply currents, examples of the present disclosure enable a better residual offset, since smaller bias voltages mean a smaller signal-to-noise ratio, so that the better signal-to-noise ratio of the method disclosed herein is more prominent here.

Figure 7:
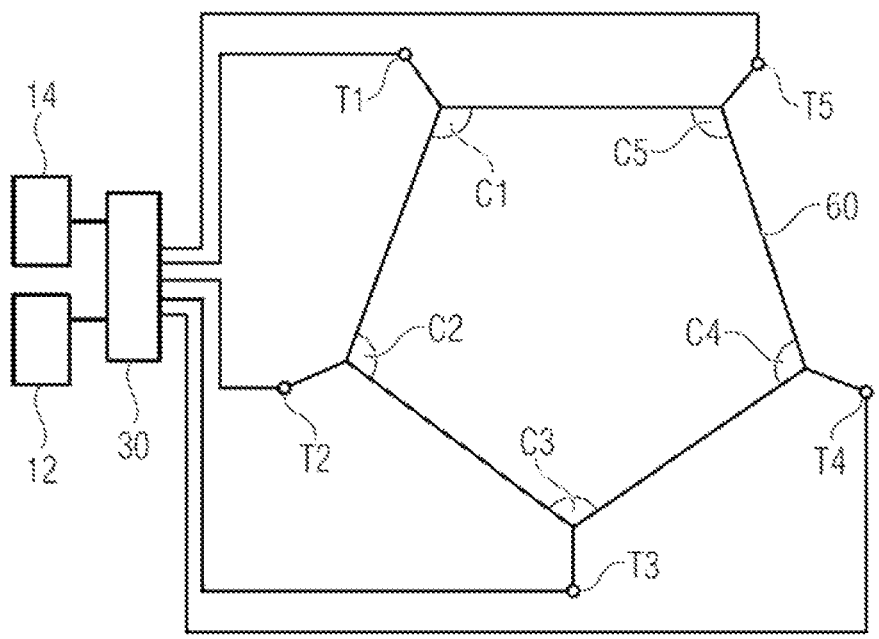
FIG. 7 shows a schematic representation of one example of a Hall sensor apparatus with five connections.

In examples of the present disclosure, an odd number of connections can be provided. FIG. 7 shows one example of a Hall effect sensor with an odd number of contacts and assigned connections, i.e. five.

As shown in FIG. 7, the Hall sensor apparatus has a Hall effect field 60 in the shape of a regular pentagon. A contact C1 to C5 is formed on each corner of the Hall effect field 60. Alternatively, the contacts can also be located in each case in the middle of the sides of the pentagon or even shifted in each case in clockwise (or counterclockwise) from the middle, wherein a higher degree of symmetry of the arrangement tends to result in a smaller offset error. Each contact C1 to C5 is connected in each case to an assigned connection T1 to T5. In line with the above description of FIGS. 2 and 5, the connections T1 to T5 can be coupled selectively by means of a control circuit 30 to the respective connections of a supply circuit 12 and a measurement circuit 14. The control circuit 30 is, for its part, optional, wherein, for example, in a case where an alternating magnetic field is to be measured, a switchover in order to interchange the functionalities of the supply connections and measurement connections is not necessary.

Figure 8A:
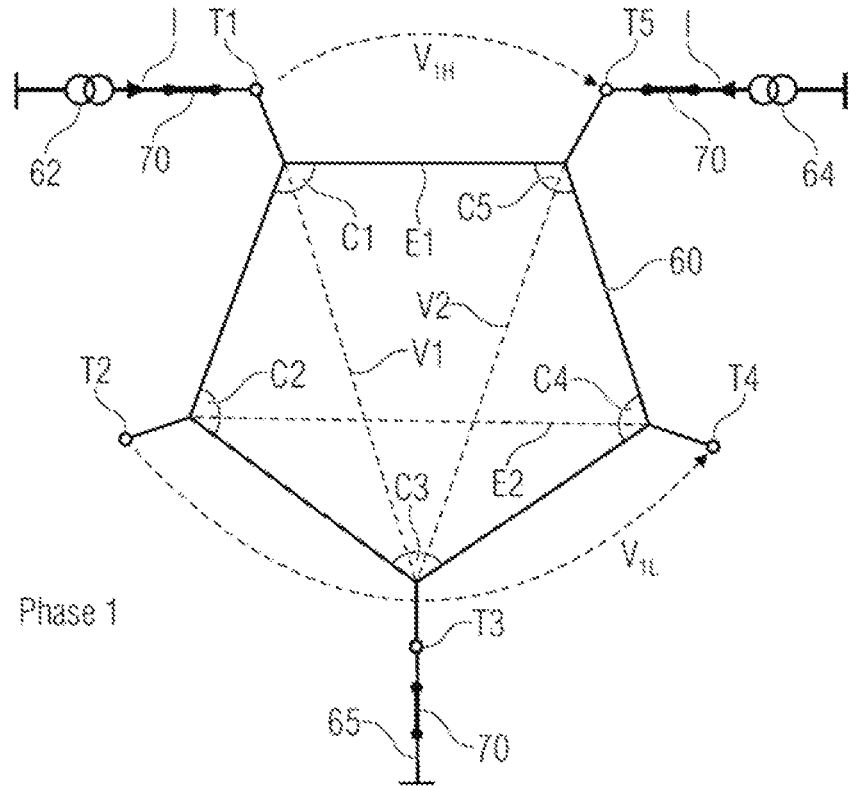
FIGS. 8A-8E show schematic representations to explain different operational phases of the Hall sensor apparatus shown in FIG. 7.
Figure 8B:
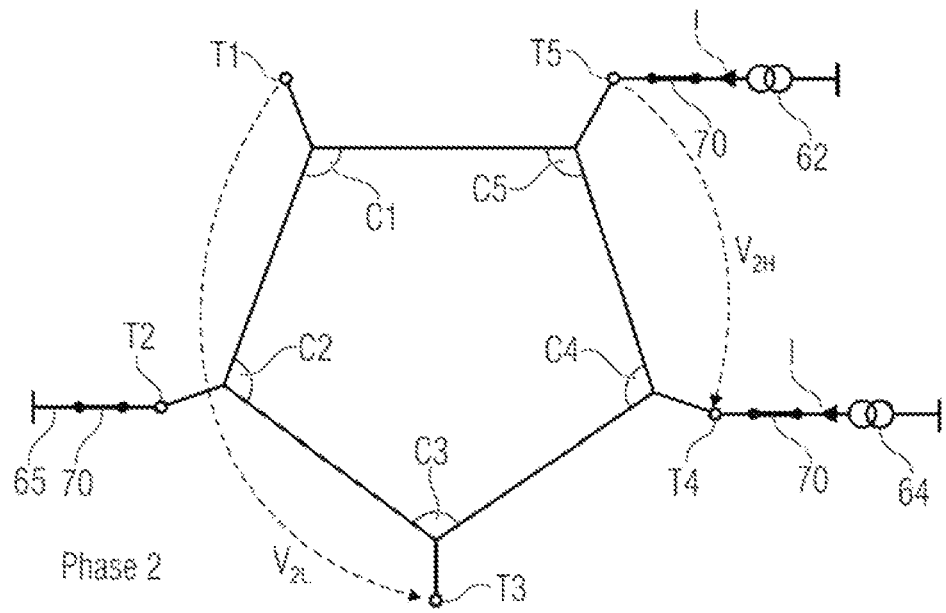
Figure 8C:
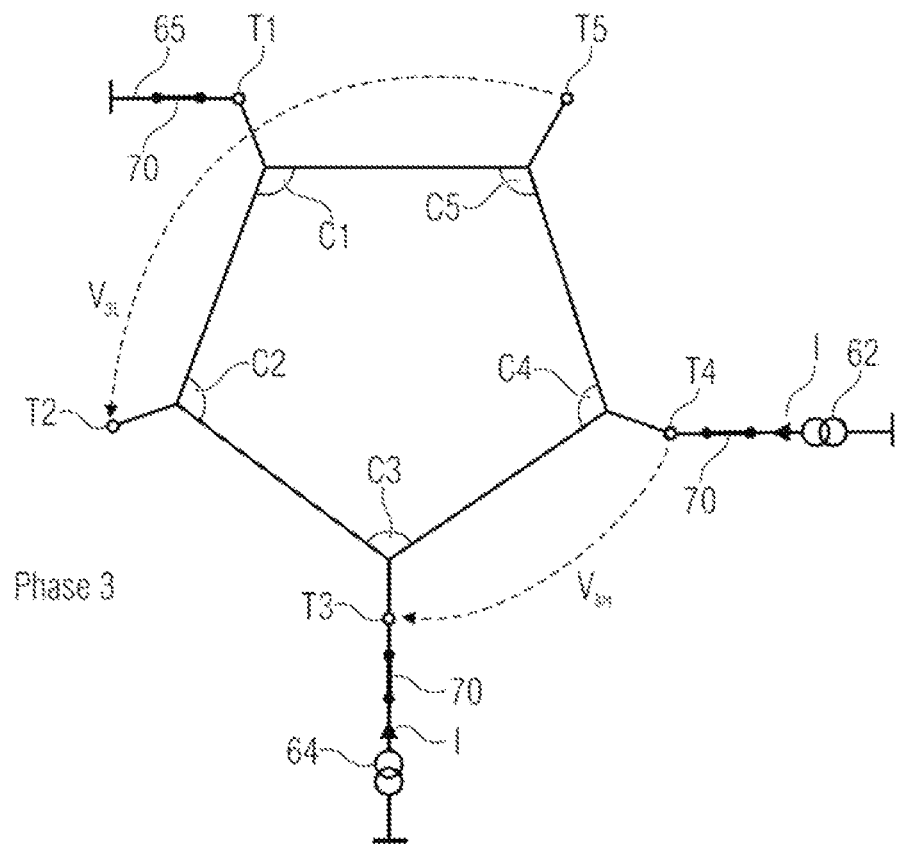
Figure 8D:
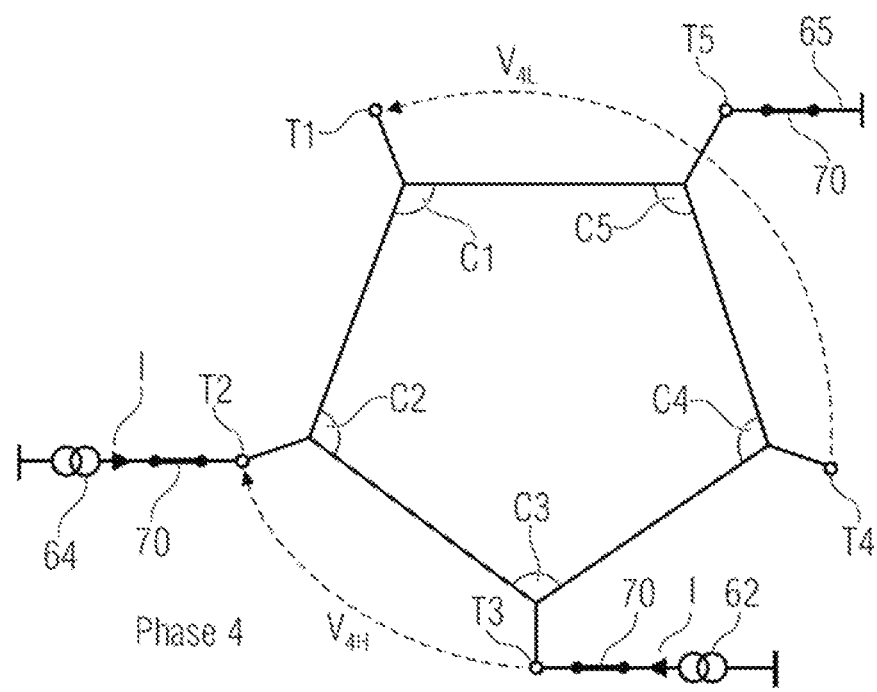

A group of two connections which are connected to contacts adjacent to one another, and a third connection which is connected to a contact between which and the contacts adjacent to one another a further contact is in each case arranged, are coupled to the supply circuit. FIG. 8A shows, for example, a first operational phase in which the group of connections T1, T5 and T3 are coupled to the supply circuit. The supply circuit has two separate current sources 62, 64 and a reference potential connection 65, for example ground, as shown in FIG. 8A. To be more precise, each of the connections T1 and T5 is coupled to one of the separate current sources 62 and 64, whereas the connection T3 is coupled to the reference potential connection.

The two adjacent connections which are coupled to the separate current sources 62 and 64 are furthermore coupled to the measurement circuit (not shown in FIGS. 8A to 8E) in order to measure a first Hall signal $V_{1H}$. A further contact C2 is arranged between the contacts C1 and C3 (along the circumference of the Hall effect field) and a further contact C4 is arranged between the contacts C3 and C5. The connections T2 and T4 connected to the contacts C2 and C4 are similarly coupled to the measurement circuit in order to measure a second Hall signal $V_{1L}$ between said contacts. A preferably identical supply current I is fed through both connections T1 and T5 which are connected to the current sources 62 and 64 into the Hall effect field 60 and flows via the connection T3 out of the Hall effect field. Hall signals are picked up between the measurement pairs T1-T5 and T2-T4. In this example, the potentials on both of the connections T1, T5 on which current is fed in are therefore also used simultaneously to pick up a Hall signal, for example a voltage. The Hall signal $V_{1H}$ which is picked up on the connections T1-T5 is at a different common-mode potential compared with the Hall signal $V_{1L}$ which is picked up on the connections T2-T4, since the current fed in via the two contacts C1 and C5 has passed through a potential gradient between the two signals. Here also, a virtual straight line E1 between the contacts of the first measurement pair and a virtual straight line E2 between the contacts of the second measurement pair intersect virtual lines V1 and V2 which in each case represent a contact on which current is fed into the Hall effect field 60, and a contact on which the current leaves the Hall effect field 60, at different positions. The virtual line E1 essentially coincides with an edge of the Hall effect field 60. It should additionally be noted that each current source can be replaced with a voltage source and the signals between the connections T1-T5 and T2-T4 can be measured by means of ammeters rather than voltmeters. In this case also, both signals are at different common-mode potentials.

A control circuit 30 can again be provided in order to switch over between different operational phases. For this purpose, the control circuit 30 can have switches in order to couple the connections T1 to T5 selectively to the measurement circuit and to the supply circuit. The control circuit can be designed to implement a spinning-current mode, as described below with reference to FIGS. 8A to 8E. In FIGS. 8A to 8E, only closed switches 70 are shown in each case which couple the respective group of three connections to the supply circuit 12.

Figure 8E:
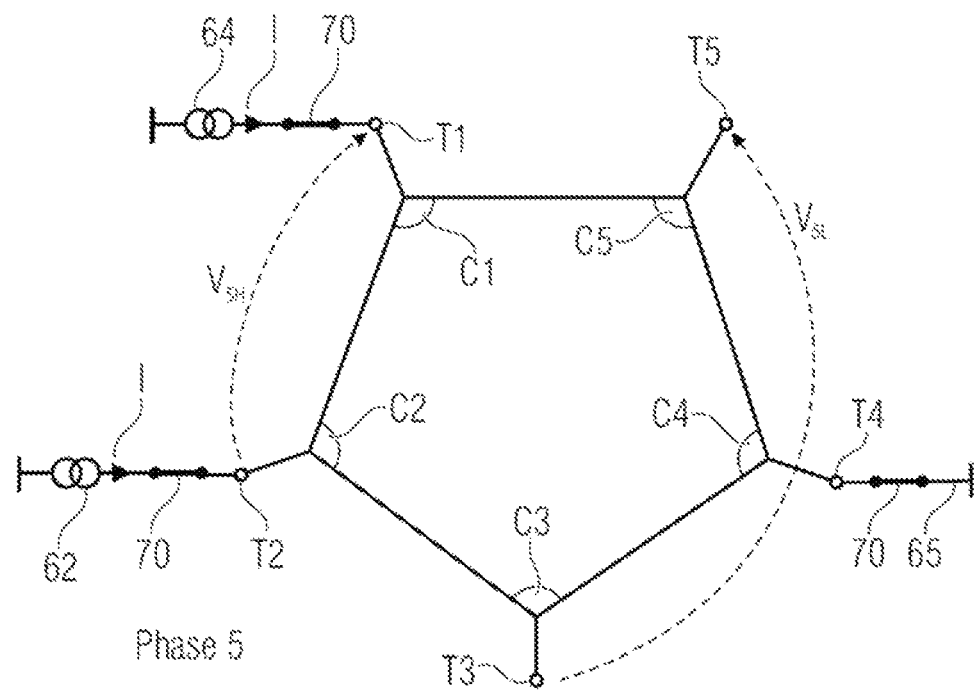

As is evident from FIGS. 8A to 8E, the control circuit can be designed to couple a different group of three connections to the supply circuit in each operational phase of the spinning-current mode. In phase 1, the connections T1, T5 and T3 are coupled to the supply circuit (FIG. 8A), in phase 2, the connections T5, T4 and T2 are coupled to the supply circuit (FIG. 8B), in phase 3 the connections T4, T3 and T1 are coupled to the supply circuit (FIG. 8C), in phase 4 the connections T3, T2 and T5 are coupled to the supply circuit (FIG. 8D) and in phase 5 the connections T2, T1 and T4 are coupled to the supply circuit (FIG. 8E). A first Hall signal is picked up in each case between the connections which are coupled to the separate current sources 62 and 64, and a second Hall signal is picked up between the connections which are not coupled to the supply circuit. In phase 1, a first Hall signal $V_{1H}$ is picked up between the connections T1 and T5, and a second Hall signal $V_{1L}$, is picked up between the connections T2 and T4. In phase 2, a first Hall signal $V_{2H}$ is picked up between the connections T5 and T4, and a second Hall signal $V_{2L}$ is picked up between the connections T1 and T3. In phase 3, a first Hall signal $V_{3H}$ is picked up between the connections T3 and T4, and a second Hall signal $V_{3L}$ is picked up between the connections T2 and T5. In phase 4, a first Hall signal $V_{4H}$ is picked up between the connections T3 and T2, and a second Hall signal $V_{4L}$ is picked up between the connections T4 and T1. In phase 5, a first Hall signal $V_{5H}$ is picked up between the connections T2 and T1, and a second Hall signal $V_{5L}$ is picked up between the connections T3 and T5.

In the spinning-current method, as shown in FIGS. 8A to 8E, each pair of adjacent contacts is thus coupled at least once to the supply circuit in the five phases. A different group of three connections is furthermore coupled to the supply circuit in each operational phase of a spinning-current mode.

A total output signal can be calculated as follows from the measured Hall signals:

$$V_{total}=V_{1H}+V_{2H}+V_{3H}+V_{4H}+V_{5H}+x(V_{1L}+V_{2L}V_{3L}+V_{4L}+V_{5L}).$$

The Hall signals which have the letter L in the index are measured in each case at different common-mode potentials compared with the signals which have the letter H in the index.

The letter x in the above equation can again represent a weighting coefficient which, in the ideal case, can be 1. The weighting coefficient can again be determined empirically through a test series and can result in a maximum signal-to-noise ratio. The currents supplied by the separate current sources 62 and 64 are preferably identical. In alternative examples, the supplied currents can also be different.

In the example described, one of the three contacts which is coupled to the supply circuit is connected in each case to ground. Alternatively, a high potential can be applied to this connection and the polarity of the current sources can be inverted. Alternatively or additionally, further operational phases could be implemented as a result, for example five further operational phases, the output signals of which could then be combined with the output signals obtained in the other operational phases.

In the examples described thus far, the Hall effect fields are implemented in each case by Hall plates. In alternative examples, the Hall effect fields can be implemented by vertical Hall elements.

Figure 9:
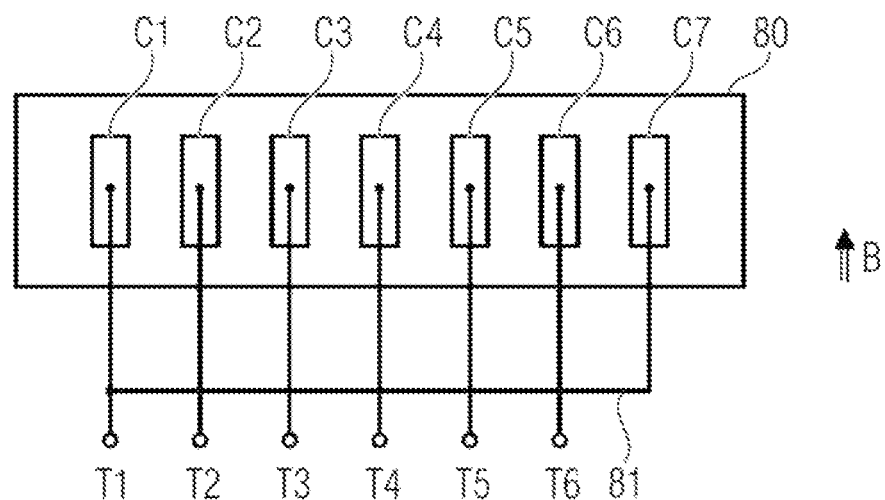
FIG. 9 shows a schematic representation of one example of a vertical Hall sensor apparatus with six connections and seven contacts.
Figure 10A:
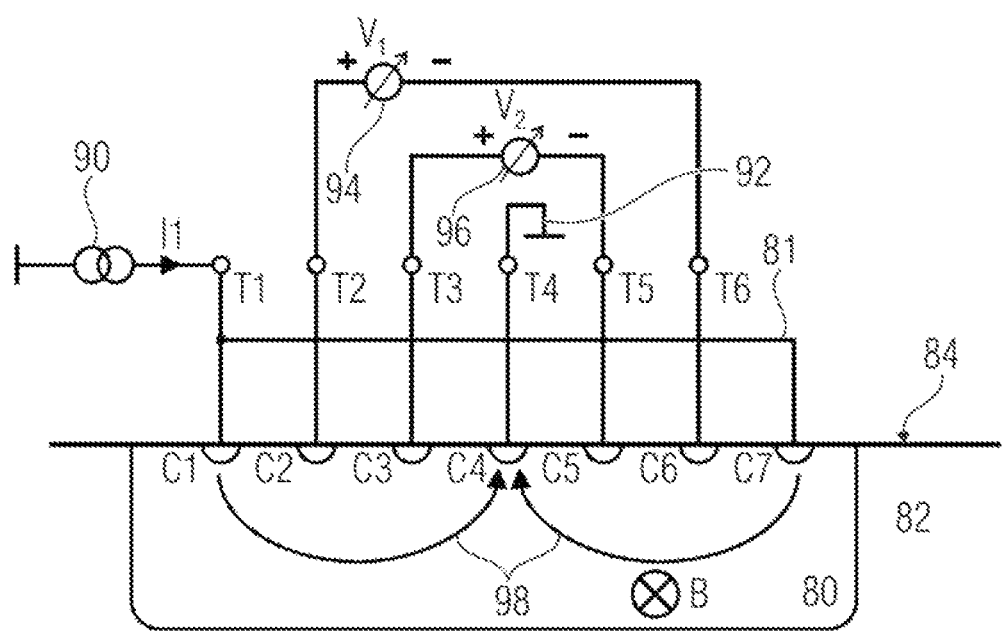
FIGS. 10A-10C show schematic representations to explain different operational phases of the Hall sensor apparatus shown in FIG. 9.

FIG. 9 shows schematically one example of a vertical Hall effect field 80 in the form of a strip in a top view (i.e. perpendicular to the main surface 84 of the substrate according to FIG. 10A), wherein seven contacts C1-C7 are disposed next to one another along a straight line. The seven contacts are connected to six connections, wherein the contacts C1 and C7 are connected via a connection 81 outside the Hall effect field 80 to a common connection T1, while each of the contacts C2 to C6 has its own connection T2 to T6. The two outer contacts are thus connected to a common connection.

Figure 10B:
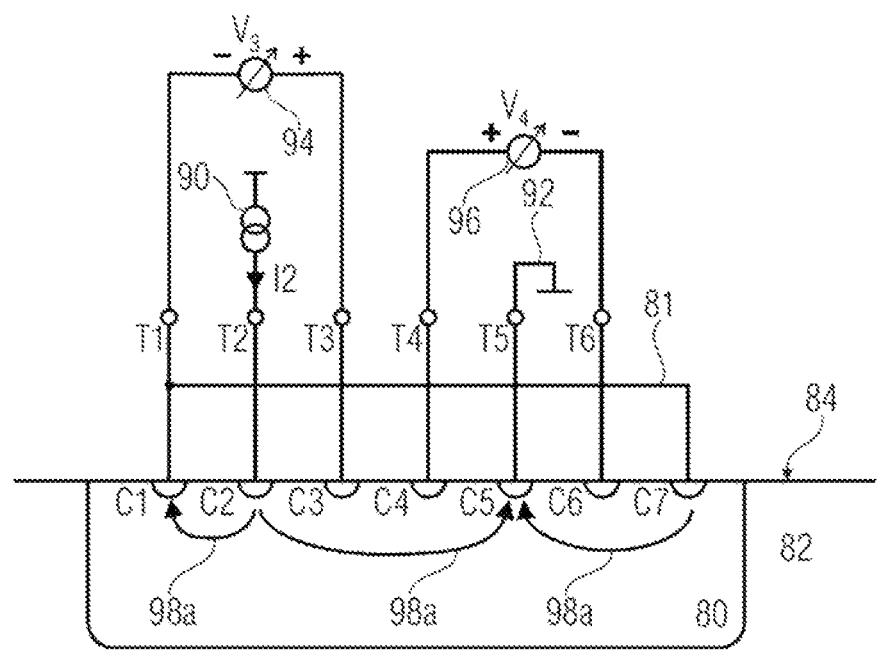
Figure 10C:
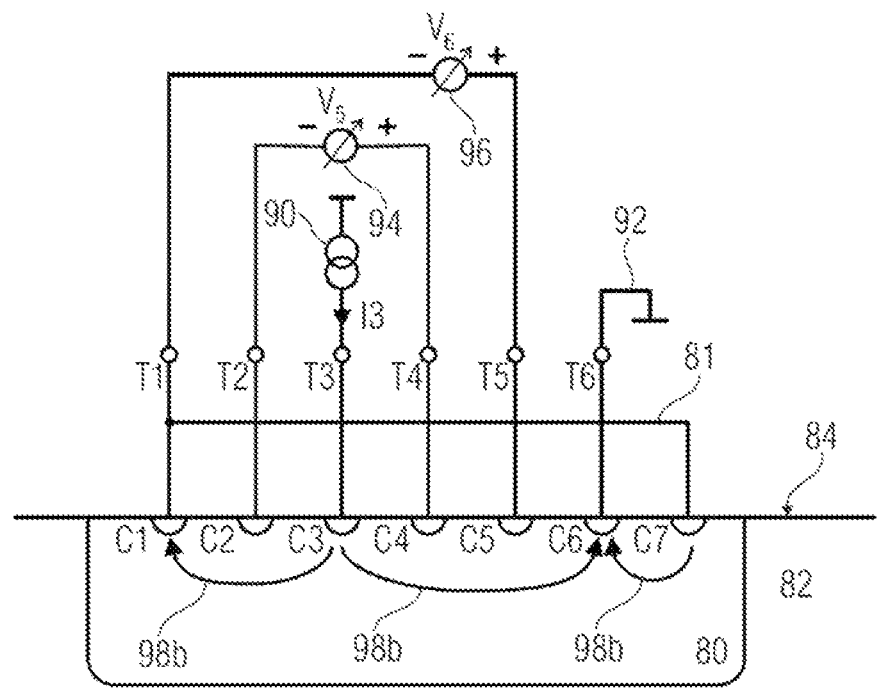

The Hall effect field 80 can in turn be formed by a doped semiconductor well in a semiconductor substrate, for example an n-well in a p-substrate. FIG. 10A shows schematically a cross-sectional representation of the Hall effect field 80 in a semiconductor substrate 82 which has a main surface 84. The Hall sensor apparatus which has the vertical Hall element is designed to measure magnetic field components B parallel to the main surface 84. The Hall sensor apparatus has a supply circuit in the form of a current source 90 and a reference potential connection 92, for example ground. The Hall sensor apparatus furthermore has a measurement circuit which is illustrated in FIGS. 10A to 10C as two voltmeters 94 and 96. Two of the connections are connected in each case to the supply circuit in one operational phase, while the other four connections are connected to the measurement circuit.

FIG. 10A shows a first operational phase in which the connections T1 and T4 are connected to the supply circuit, while the connections T2 and T6 form a first measurement pair and the connections T3 and T5 form a second measurement pair. The connection T1 is connected to the current source 90 of the supply circuit, and the connection T4 is connected to the reference potential connection 92. The current source 90 supplies a current I1 which flows through the contacts C1 and C7 into the Hall effect field 80 and to the contact C4, as indicated by arrows 98 in FIG. 10A. A first Hall signal V1 is measured between the connections T2 and T6, and a second Hall signal V2 is measured between the connections T3 and T5. Two output signals are thus measured in one operational phase with the same current through the Hall effect field. Due to the arrangement of the contacts in the Hall effect field, the output signals are measured at different common-mode potentials.

A control circuit with corresponding switches which are not shown in FIGS. 10A to 10C can again be provided in order to switch over the functionality of the connections in other operational phases. FIGS. 10B and 10C thus show a second operational phase and a third operational phase.

In the second operational phase, as shown in FIG. 10B, the connections T2 and T5 are connected to the supply circuit, while the connections T1 and T3 are connected to the measurement circuit as a first measurement pair and the connections T4 and T6 as a second measurement pair. The measurement circuit is again shown schematically by means of voltmeters 94, 96. The connection T2 is connected to the current source 90 of the supply circuit, and the connection T5 is connected to the reference potential connection 92. The current source 90 generates a current I2 which enters the Hall effect field 80 through the contact C2 and flows from there directly and via the contacts C1 and C7 and the connection 81 between these contacts to the contact C5, as indicated by arrows 98a in FIG. 10B. During the second operational phase, two Hall signals are similarly measured at different common-mode potentials, i.e. a third Hall signal $V_3$ between the contacts T1 and T3 and a second Hall signal $V_4$ between the contacts T4 and T6.

In the third operational phase which is shown FIG. 10C, the connections T3 and T6 are connected to the supply circuit, and the connections T1, T2, T4 and T5 are connected to the measurement circuit. More precisely, the connection T3 is connected to the current source 90 which generates a current I4 which enters the semiconductor field 80 via the contact C3 and flows directly or via the contacts C1 and C7 and the external connection 81 of said contacts to the contact C6. This is indicated by arrows 98b in FIG. 10C. The connection T6 is coupled to the reference potential 92. Also in the third operational phase, two Hall signals are measured at different common-mode potentials, i.e. a first Hall $V_5$ between the connections T2 and T4 and a second Hall signal $V_6$ between the connections T1 and T5.

In a spinning-current mode, it is possible to switch over between the three operational phases shown in FIGS. 10A to 10C, wherein the currents I1, I2 and I3 are preferably identical so that the following applies: I1=I2=I3. An output signal can then be calculated as follows: $V_{total}=V_1+V_2+V_3+V_4+V_5+V_6$. As explained above in relation to other examples, weighting factors can be determined empirically here also which can result in an optimization of the signal-to-noise ratio and with which the respective measured voltages can be multiplied before the addition.

Also in the example described with reference to FIGS. 9 to 10C, the current directions and voltage directions can be inverted in order to generate alternative or additional operational phases. The connection T4, for example, can be coupled in the first operational phase to the current source, while the connection T1 is connected to the reference potential. Furthermore alternatively, the connection T4 could be connected to a high potential in the first operational phase and the current direction of the current source 90 could be inverted. The Hall signals obtained in further or alternative operational phases of this type could similarly be combined with the Hall signals obtained in the other operational phases in order to further improve the signal-to-noise ratio and the residual offset error.

In examples, the measured differential signals can be combined for each operational phase, whereupon the signals thereby obtained can be combined over all operational phases. In examples, the differential signals obtained over all operational phases can be combined with one another without first combining the differential signals for each operational phase. In examples, individual differential signals can first be combined in each case with one another over all operational phases, whereupon the signals thereby obtained can then be combined. For example, with reference to FIGS. 6A to 6H, all Uhall_1 could be combined over eight phases, and furthermore all Uhall_2, and similarly all Uhall_3, and only then could the three signals thereby obtained be combined, for example with a different weighting factor. The total signal can thus be a linear combination of the individual signals, wherein all individual signals have weighting factors which are identical in terms of amount at the same common-mode potential.

In examples, the differential signals are combined so that the absolute values of all weighting factors of the linear combination are identical, i.e. they are incorporated with the same weighting. They can be added or (partially) subtracted.

In examples of the present disclosure, the current which flows through one of the two contacts of a supply pair into the Hall effect field corresponds to the current which flows through the other of the two contacts of the supply pair out of the Hall effect field. Examples of this are the Hall sensor apparatuses shown in FIGS. 1 and 5.

In examples of the present disclosure, the supply current enters the Hall effect field via precisely one individual connection and leaves the Hall effect field via precisely one other individual connection. The supply current can thus enter the Hall effect field entirely via one connection and can leave the Hall effect field entirely through one other connection.

Examples of the present disclosure have been described above, particularly with reference to Hall sensor apparatuses. It is obvious to persons skilled in the art that the description of respective functionalities of the Hall sensor apparatuses in the same way represent a description of steps of a method for measuring a magnetic field using a Hall sensor apparatus. Examples of the present disclosure thus provide corresponding methods for measuring a magnetic field using a Hall sensor apparatus with a Hall effect field and at least five connections, each of which is connected to at least one contact for the Hall effect field. During one operational phase, the method comprises coupling a group of at least two connections to a supply circuit in order to generate a supply current through the Hall effect field and coupling a first and second pair of the connections as measurement pairs to a measurement circuit in order to measure a first Hall signal between the connections of the first pair and a second Hall signal between the connections of the second pair at a different common-mode potential compared with the first Hall signal. An increased signal-to-noise ratio with reduced current consumption can be achieved by measuring two Hall signals with the application of the same supply current.

In examples of a method of the present disclosure, a second group of connections which differs from the first group is coupled to the supply circuit in a second operational phase, and two other pairs of connections which differ from the first and second pair are coupled to the measurement circuit as measurement pairs.

In examples of the method disclosed herein, a spinning-current mode can be implemented with a Hall sensor apparatus which has N pairs of connections, wherein N is a natural number greater than or equal to 3, wherein, in each operational phase of the spinning-current mode, one pair of connections is coupled to the supply circuit as a supply pair and the remaining N−1 pairs are coupled to the measurement circuit as measurement pairs, wherein each of the N pairs serves at least once as a supply pair in the spinning-current mode, and wherein the supply current is fed through a different connection into the Hall effect field in each operational phase of the spinning-current mode.

In examples of the method disclosed herein, a measurement signal which is based on a linear combination of the Hall signals measured during each operational phase can be generated for each operational phase. In examples of the method disclosed herein, weighting factors which depend on the geometric arrangement of the contacts which are connected to the connections of the measurement pairs can be used in a calculation of the linear combination. In examples, the linear combination is an addition. In examples, the measurement signals of all operational phases are added together. In other examples, other linear combinations, for example a subtraction, can be used.

Although examples with a specific number of contacts and connections have been described with reference to the figures, it is clear that other examples can have a different number of contacts and a different number of connections. It is furthermore clear that the Hall effect field can have shapes other than the shapes described.

Although some aspects have been described in the context of an apparatus, it is clear that these aspects also represent a description of the corresponding methods for measuring a magnetic field, wherein a block or an apparatus can correspond to a method step or a feature of a method step. Similarly, aspects which are described in the context of a method step can also represent a description of a corresponding block or item or feature of a corresponding apparatus. Some or all method steps can be carried out by (or using) a hardware apparatus, such as, for example, a microprocessor, a programmed computer or electronic circuit. In some examples, one or more method steps can be carried out by an apparatus of this type. In particular, the supply circuit, the measurement circuit and/or the control circuit can be implemented in examples by any suitable circuit structures, for example microprocessor circuits, ASIC circuits, CMOS circuits and the like.

The examples described above are intended simply to illustrate the principles of the present disclosure. Modifications and variations of the arrangements and details described herein will obviously be evident to persons skilled in the art. The protective scope is therefore intended to be defined only by the following patent claims.

What is claimed is:

1. A Hall sensor apparatus, comprising:
   a Hall effect region with at least five contacts which are wired to at least five connections,
      wherein none of the at least five contacts is wired to more than one of the at least five connections;
   a supply circuit;
   a measurement circuit,
      wherein the Hall sensor apparatus is configured so that a supply current enters the Hall effect region or leaves the Hall effect region through one single connection of the at least five connections in a first operational phase, and differential signals are measured at different common-mode potentials in each case between two of the at least five connections, and
      wherein the measurement circuit is configured to combine the measured differential signals into a total signal; and
   a control circuit configured to:

couple a first group of at least two connections of the at least five connections to the supply circuit in the first operational phase, and
couple a second group, differing from the first group, of at least two connections of the at least five connections to the supply circuit in a second operational phase.

2. The Hall sensor apparatus as claimed in claim 1, wherein the control circuit is configured to:
couple the at least five connections selectively to the supply circuit and to the measurement circuit in more than one operational phase so that the supply current enters the Hall effect region or leaves the Hall effect region through one single connection of the at least five connections in each operational phase, and differential signals are measured at different common-mode potentials in each operational phase.

3. The Hall sensor apparatus as claimed in claim 1, wherein the control circuit is configured to:
couple a first pair and a second pair of the at least five connections to the measurement circuit in the first operational phase, and
couple two other pairs, differing from the first pair and the second pair, of the at least five connections to the measurement circuit in the second operational phase.

4. The Hall sensor apparatus as claimed in claim 1, wherein the at least five connections have N pairs of connections,
wherein N is a natural number greater than or equal to 3, and
wherein the control circuit is configured to:
implement a spinning-current mode,
wherein one pair of the at least five connections is coupled to the supply circuit as a supply pair and a remaining N−1 pairs are coupled to the measurement circuit as measurement pairs in each operational phase of the spinning-current mode,
wherein each of the N pairs is to serve at least once as the supply pair in the spinning-current mode, and
wherein the supply current is fed through a different connection into the Hall effect region in each operational phase of the spinning-current mode.

5. The Hall sensor apparatus as claimed in claim 1, wherein one pair of the at least five connections is coupled to the supply circuit as a supply pair and two pairs of the at least five connections are connected to the measurement circuit as measurement pairs in the first operational phase,
wherein a direction, in which contacts of the at least five contacts which are connected to the one pair are located opposite one another, is perpendicular to directions in which other contacts of the at least five contacts which are connected to the two pairs are located opposite one another.

6. The Hall sensor apparatus as claimed in claim 1, wherein connections of a first contact of the at least five contacts and a second contact, whose distance from the first contact is greater than distances from all other contacts of the at least five contacts, are coupled to the supply circuit as a supply pair.

7. The Hall sensor apparatus as claimed in claim 1, wherein the at least five connections have 2N−1 connections,
where N≥3 and is a natural number,
wherein three connections of the at least five connections are coupled to the supply circuit in the first operational phase, wherein an electrical resistance through the Hall effect region between a first connection and a third connection of the three connections and an electrical resistance through the Hall effect region between a second connection of the three connections and the third connection are equal, and
wherein 2N−2 connections of the at least five connections form N−1 connection pairs in the first operational phase,
wherein the differential signals are measured at different common-mode potentials on 2≤M≤N−1 connection pairs,
where M is a natural number.

8. The Hall sensor apparatus as claimed in claim 1, wherein the at least five connections have 2N−1 connections,
where N≥3 and is a natural number, and
wherein the control circuit is configured to:
couple three connections of the at least five connections to the supply circuit in each operational phase,
wherein an electrical resistance through the Hall effect region between a first connection and a third connection of the three connections and an electrical resistance through the Hall effect region between a second connection and the third connection are equal, and
wherein 2N−2 connections of the at least five connections form N−1 connection pairs in each operational phase,
wherein the differential signals are measured at different common-mode potentials on 2≤M≤N−1 connection pairs,
where M is a natural number.

9. The Hall sensor apparatus as claimed in claim 1, wherein the at least five contacts are arranged symmetrically in relation to an axis of symmetry through the Hall effect region and/or in relation to a geometric center of the Hall effect region.

10. The Hall sensor apparatus as claimed in claim 1, wherein the measurement circuit, when combining the measured differential signals into the total signal, is configured to:
combine differential signals measured in one or each operational phase into the total signal,
wherein the total signal is based on a linear combination of the differential signals measured in one or each operational phase.

11. The Hall sensor apparatus as claimed in claim 10, wherein the measurement circuit is configured to:
use weighting factors in a calculation of the linear combination,
wherein differential signals which are measured at a same common-mode potential have same weighting factors in terms of amount.

12. The Hall sensor apparatus as claimed in claim 1, wherein the at least five contacts are arranged with a uniform angular separation around a circumference of the Hall effect region.

13. A method for measuring a magnetic field using a Hall sensor apparatus with a Hall effect region with at least five contacts which are wired to at least five connections, wherein none of the at least five contacts is wired to more than one of the at least five connections, and wherein the method comprises:
generating a supply current through the Hall effect region, wherein the supply current enters the Hall effect region or leaves the Hall effect region through one single connection of the at least five connections;

measuring first differential signals at a first common-mode potential between a first pair of the at least five connections in a first operational phase;

measuring second differential signals at a second common-mode potential between a second pair of the at least five connections in the first operational phase;

combining the measured first differential signals and the measured second differential signals into a first signal;

measuring third differential signals at a third common-mode potential between a third pair of the at least five connections in a second operational phase;

measuring fourth differential signals at a fourth common-mode potential between a fourth pair of the at least five connections in the second operational phase; and combining the measured third differential signals and the measured fourth differential signals into a second signal.

14. The method as claimed in claim 13, wherein the at least five connections are coupled selectively to a supply circuit and to a measurement circuit in more than one operational phase so that the supply current enters the Hall effect region or leaves the Hall effect region through one single connection of the at least five connections in each operational phase, and differential signals are measured at different common-mode potentials in each operational phase.

15. The method as claimed in claim 13, wherein the at least five connections have N pairs of connections,
wherein N is a natural number greater than or equal to 3, and
wherein the method further comprises:
implementing a spinning-current mode,
wherein one pair of the at least five connections is coupled to a supply circuit as a supply pair and a remaining N−1 pairs of the at least five connections are coupled to a measurement circuit as measurement pairs in each operational phase of the spinning-current mode,
wherein each of the N pairs serves at least once as a supply pair in the spinning-current mode, and
wherein the supply current is fed through a different connection into the Hall effect region in each operational phase of the spinning-current mode.

16. The method as claimed in claim 13, wherein the at least five connections have 2N−1 connections,
where N≥3 and is a natural number,
wherein three connections of the at least five connections are coupled to a supply circuit in each operational phase,
wherein an electrical resistance through the Hall effect region between a first connection and a third connection of the three connections and an electrical resistance through the Hall effect region between a second connection and the third connection are equal, and
wherein 2N−2 connections of the at least five connections form N−1 connection pairs in each operational phase,
wherein differential signals are measured at different common-mode potentials on 2≤M≤N−1 connection pairs,
where M is a natural number.

17. The method as claimed in claim 13, wherein the measured first differential signals, the measured second differential signals, the measured third differential signals, and the measured fourth differential signals combined into a total signal,
wherein the total signal is based on a linear combination of the measured first differential signals, the measured second differential signals, the measured third differential signals, and the measured fourth differential signals.

18. The method as claimed in claim 17, wherein weighting factors are used in a calculation of the linear combination, wherein differential signals which are measured at a same common-mode potential have a same weighting factors in terms of amount.

19. A Hall sensor apparatus, comprising:
a Hall effect region with at least five contacts which are wired to at least five connections,
wherein none of the at least five contacts is wired to more than one of the at least five connections;
a supply circuit;
a measurement circuit; and
a control circuit configured to:
couple the at least five connections selectively to the supply circuit and to the measurement circuit in more than one operational phase so that a supply current enters the Hall effect region or leaves the Hall effect region through a single connection of the at least five connections in each operational phase, and differential signals are measured at different common-mode potentials in each operational phase,
wherein a first pair and a second pair of the at least five connections are coupled to the measurement circuit in a first operational phase, and
wherein two other pairs, differing from the first pair and the second pair, of the at least five connections are coupled to the measurement circuit in a second operational phase.

20. The Hall sensor apparatus as claimed in claim 19, wherein the measurement circuit is configured to:
combine differential signals measured in one or each operational phase into a total signal,
wherein the total signal is based on a linear combination of the differential signals measured in one or each operational phase.

* * * * *

UNITED STATES PATENT AND TRADEMARK OFFICE
CERTIFICATE OF CORRECTION

| | |
|---|---|
| PATENT NO. | : 11,073,574 B2 |
| APPLICATION NO. | : 16/218852 |
| DATED | : July 27, 2021 |
| INVENTOR(S) | : Udo Ausserlechner |

It is certified that error appears in the above-identified patent and that said Letters Patent is hereby corrected as shown below:

In the Claims

In Claim 17, Column 24, Line 12, "differential signals combined" should be changed to --differential signals are combined--.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*